(12) United States Patent
Zimmermann

(10) Patent No.: US 10,976,668 B2
(45) Date of Patent: Apr. 13, 2021

(54) ILLUMINATION OPTICAL UNIT AND OPTICAL SYSTEM FOR EUV PROJECTION LITHOGRAPHY

(71) Applicant: Carl Zeiss SMT GmbH, Oberkochen (DE)

(72) Inventor: Joerg Zimmermann, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/598,408

(22) Filed: Oct. 10, 2019

(65) Prior Publication Data
US 2020/0041911 A1 Feb. 6, 2020

Related U.S. Application Data

(63) Continuation of application No. 14/510,725, filed on Oct. 9, 2014, now abandoned, which is a continuation
(Continued)

(30) Foreign Application Priority Data

May 3, 2012 (DE) .......................... 102012207377.9

(51) Int. Cl.
*G03F 7/20* (2006.01)

(52) U.S. Cl.
CPC .......... *G03F 7/70191* (2013.01); *G03F 7/702* (2013.01); *G03F 7/70075* (2013.01);
(Continued)

(58) Field of Classification Search
CPC .. G03F 7/70191; G03F 7/702; G03F 7/70075; G03F 7/20; G03F 7/2002;
(Continued)

(56) References Cited

U.S. PATENT DOCUMENTS 5,420,436 A 5/1995 Seya et al.
5,680,588 A * 10/1997 Gortych ................ G03F 7/2022
430/30
(Continued)

FOREIGN PATENT DOCUMENTS

DE 10 2006 059 024 6/2008
DE 10 2007 019 570 A1 10/2008
(Continued)

OTHER PUBLICATIONS

International Search Report for corresponding PCT Appl No. PCT/EP2013/058171, dated Aug. 21, 2013.
(Continued)

*Primary Examiner* — Christina A Riddle
(74) *Attorney, Agent, or Firm* — Fish & Richardson P.C.

(57) ABSTRACT

An illumination optical unit for EUV projection lithography serves for obliquely illuminating an illumination field, in which an object field of a downstream imaging catoptric optical unit and a reflective object to be imaged can be arranged. A pupil generating device of the illumination optical unit is embodied so that an illumination pupil results, which brings about a dependency of an imaging telecentricity against a structure variable of the object to be imaged. This dependency is such that a dependency of the imaging telecentricity against the structure variable of the object to be imaged on account of interaction of the oblique illumination with structures of the object to be imaged is at least partly compensated for. An optical system for EUV projection lithography also has an imaging catoptric optical unit alongside an illumination optical unit and can additionally have a wavefront manipulation device.

21 Claims, 17 Drawing Sheets

Related U.S. Application Data of application No. PCT/EP2013/058171, filed on Apr. 19, 2013.

(60) Provisional application No. 61/642,683, filed on May 4, 2012.

(52) U.S. Cl.
 CPC ...... *G03F 7/70116* (2013.01); *G03F 7/70125* (2013.01); *G03F 7/70258* (2013.01)

(58) Field of Classification Search
 CPC . G03F 7/70083; G03F 7/70091–70116; G03F 7/70125; G03F 7/70233; G03F 7/7025; G03F 7/70258; G03F 7/70266; G03F 7/70308; G03F 7/70641; G03F 7/70675; G03F 7/70483; G03F 7/70491; G03F 7/705; G03F 7/70508; G03F 7/7085; H01L 51/50
 USPC ............. 355/52, 53, 55, 67–71, 75, 77; 250/492.1, 492.2, 492.22, 548; 430/5, 8, 430/30, 311, 312, 394
 See application file for complete search history.

(56) References Cited

U.S. PATENT DOCUMENTS

| | | | |
|---|---|---|---|
| 6,859,515 B2 | 2/2005 | Schultz et al. | |
| 2002/0145719 A1* | 10/2002 | Govil | G03F 7/70625 355/69 |
| 2004/0137677 A1* | 7/2004 | Lowisch | B82Y 10/00 438/232 |
| 2007/0046921 A1* | 3/2007 | Takahashi | G03F 7/70566 355/71 |
| 2008/0013680 A1 | 1/2008 | Singer et al. | |
| 2008/0239268 A1* | 10/2008 | Mulder | G03F 7/70516 355/67 |
| 2009/0040497 A1 | 2/2009 | Kawakami | |
| 2009/0097001 A1 | 4/2009 | Trogisch et al. | |
| 2009/0251677 A1* | 10/2009 | Endres | G02B 27/0905 355/71 |
| 2011/0063598 A1 | 3/2011 | Fiolka et al. | |
| 2011/0141445 A1 | 6/2011 | Endres et al. | |
| 2011/0200946 A1 | 8/2011 | Mann et al. | |
| 2013/0100428 A1 | 4/2013 | Ruoff et al. | |
| 2013/0250265 A1 | 9/2013 | Bienert et al. | |
| 2015/0042974 A1 | 2/2015 | Zimmermann | |

FOREIGN PATENT DOCUMENTS

| | | |
|---|---|---|
| DE | 10 2008 000 990 B3 | 11/2009 |
| DE | 10 2010 003 167 A1 | 10/2010 |
| EP | 1 225 481 A | 7/2002 |
| JP | 2004-179663 A | 6/2004 |
| JP | 2009-043933 A | 2/2009 |
| JP | 2011-503831 A | 1/2011 |
| JP | 2011-124584 A | 6/2011 |
| JP | 2011-519172 A | 6/2011 |
| JP | 2013-532381 A | 8/2013 |
| JP | 2013-543658 A | 12/2013 |
| TW | 200900874 A | 1/2009 |
| TW | 201017344 A1 | 5/2010 |
| WO | WO 2011/076500 A1 | 6/2011 |
| WO | WO 2011/154244 A1 | 12/2011 |
| WO | WO 2011/157643 | 12/2011 |

OTHER PUBLICATIONS

German Office Action, with translation thereof, for corresponding DE Application No. 10 2012 207 377.9, dated Dec. 18, 2012.
Japanese office action, with English translation thereof, for JP Appl No. 2015-509 363, dated Sep. 24, 2015.
Korean office action, with English translation thereof, for KR Appl No. 10-2014-7033758, dated Mar. 18, 2016.
Taiwanese office action, with English translation thereof, for corresponding TW Appl No. 102 115 781, dated Feb. 22, 2017.

* cited by examiner

ILLUMINATION OPTICAL UNIT AND OPTICAL SYSTEM FOR EUV PROJECTION LITHOGRAPHY

CROSS-REFERENCE TO RELATED APPLICATIONS

The present application is a continuation of, and claims benefit under 35 USC 120 to, U.S. application Ser. No. 14/510,725, filed Oct. 9, 2014, which is a continuation of, and claims benefit under 35 USB 120 to, international application PCT/EP2013/058171, filed Apr. 19, 2013, which claims benefit under 35 USC 119 of German Application No. 10 2012 207 377.9, filed May 3, 3012. International application PCT/EP2013/058171 also claims priority under 35 USC 119(e) to U.S. Provisional Application No. 61/642,683, filed May 4, 2012. The entire disclosures of U.S. application Ser. No. 14/510,725, international application PCT/EP2013/058171 and German Application No. 10 2012 207 377.9 are incorporated by reference herein.

The invention relates to an illumination optical unit for EUV projection lithography for obliquely illuminating an illumination field, in which an object field of a downstream imaging catoptric optical unit and a reflective object to be imaged can be arranged. Furthermore, the invention relates to an optical system for EUV projection lithography comprising such an illumination optical unit and a projection optical unit for imaging the object field into an image field. Furthermore, the invention relates to a projection exposure apparatus comprising such an optical system, a method for setting such an optical system, a method for producing micro- or nanostructured components using such a projection exposure apparatus, and a micro- or nanostructured component, in particular a semiconductor chip, produced according to such a production method.

An illumination optical unit, an optical system, a projection exposure apparatus, a component production method and a component produced thereby are known from WO 2011/154 244 A1, DE 10 2010 003 167 A1 and WO 2011/076 500 A1. US 2009/0097001 A1 discloses a non-telecentric lithography apparatus and a method of manufacturing integrated circuits. US 2004/0137677 A1 discloses a device manufacturing method and a computer program and the use of a projection system of a lithographic apparatus in that respect.

It is an objective of the present invention to specify an illumination optical unit and an optical system whose illumination and imaging properties are improved in comparison with the prior art.

This objective is achieved according to the invention via an illumination optical unit for EUV projection lithography for obliquely illuminating an illumination field, in which an object field of a downstream imaging catoptric optical unit and a reflective object to be imaged can be arranged,
   comprising a pupil generating device, which is embodied in such a way that an illumination pupil results,
   which brings about a dependency of an imaging telecentricity on a structure variable of the object to be imaged, such that a dependency of the imaging telecentricity on the structure variable of the object to be imaged on account of an interaction of the oblique illumination with structures of the object to be imaged is at least partly compensated for.
and via an optical system for EUV projection lithography comprising an illumination optical unit for obliquely illuminating an illumination field, in which an object field of a downstream imaging catoptric optical unit and a reflective object to be imaged can be arranged, comprising the imaging catoptric optical unit,
   comprising a wavefront manipulation device, which is embodied in such a way that a wavefront of the imaging optical unit results,
   which brings about a dependency of an imaging focus shift on a structure variable of the object to be imaged, such that a dependency of the imaging focus shift on the structure variable of the object to be imaged on account of the oblique illumination is at least partly compensated for.

It has been recognized according to the invention that an interaction of the oblique illumination with structures of the reflective object leads to imaging aberrations that reduce the imaging performance of a projection exposure apparatus. The imaging aberrations can be caused by shading effects of the illumination light at the object structures, for example at lines or ridges, and a reflection behavior of the object that is dependent on the angle of incidence. The cause can be, in particular, a finite depth of the object structures. The object can have a multilayer coating (multilayer or multilayer stack) for improving its interacting properties with the illumination light. With the aid of the pupil generating device of the illumination optical unit according to the invention or with the aid of the wavefront manipulation device of the imaging optical unit or the projection optical unit of the optical system according to the invention, it is possible to bring about a compensation of imaging variables that reduce the imaging quality, which in turn leads to an improvement in the imaging performance. The pupil generating device serves for manipulating the illumination pupil of the illumination optical unit. The illumination optical unit can have a pupil facet mirror and a field facet mirror, wherein it is possible to change between different illumination settings, that is to say between different pupil facet ensembles illuminated with illumination light. In this case, the embodiment of the illumination optical unit can be such that, by tilting setting mirrors, in particular by tilting field facets of the field facet mirror, it is possible to change between different object field illumination channels with which different pupil facets of the pupil facet mirror are associated. The embodiment of the illumination optical unit can be such that, by tilting setting mirrors, in particular field facets, it is possible to change between different illumination channels with which at least one object field illumination channel which acts on a pupil facet and a turn-off illumination channel, which does not contribute to the object field illumination, are associated. WO 2011/154 244 A1 gives an example of an illumination optical unit in which it is possible to change between object field illumination channels and a turn-off illumination channel. A non-compensating imaging telecentricity can be greater than 10 mrad, can be greater than 15 mrad, can be greater than 20 mrad, can be greater than 30 mrad or can be even greater still. A compensating telecentricity deviation present overall, which can be brought about via of the compensation by the pupil generating device, over the object field, can be less than 10 mrad, can be less than 8 mrad, can be less than 5 mrad and can even be less than 3 mrad, for typical object structure variables in the range of between 20 nm and 250 nm. An oblique illumination of the illumination field is present when a chief ray of the illumination, which chief ray illuminates a central field point, has an angle with respect to the normal to the illumination field that is greater than 3°. The angle can be greater than 5°, can be greater than 6°, can be greater than 8°, can be greater than 9° and can be, in particular, at least 10°.

Illumination pupils having
a ring-shaped ring pupil contribution, and
a compensation pupil contribution within the ring of the ring pupil contribution, and having
a dipole pupil contribution, and
a compensation pupil contribution outside the dipoles of the dipole pupil contribution, have proved to be particularly suitable for compensation. Other typical illumination settings can also be compensated for, for example a quadrupole illumination setting or else mixed forms of known illumination settings. Examples of known illumination settings are given once again by WO 2011/154 244 A1.

An illumination pupil that deviates from mirror symmetry, in which the illumination pupil is not designed mirror-asymmetrically with respect to at least one main pupil coordinate wherein the main pupil coordinates are those coordinates in the illumination pupil which correspond to the main object field coordinates firstly perpendicular to an illumination plane of incidence and secondly in the illumination plane of incidence of the oblique illumination, has proved to be particularly suitable for compensation.

Alternatively or additionally, the illumination optical unit can be embodied in such a way that the illumination pupil has a pole imbalance with respect to at least one main pupil coordinate, which pole imbalance in terms of absolute value is greater than 1%, in terms of absolute value is greater than 2%, in terms of absolute value is greater than 5%, in terms of absolute value is greater than 7%, in terms of absolute value is greater than 9%, in terms of absolute value is greater than 10% or in terms of absolute value is even greater still. The pole imbalance (PB) is in this case defined as $$PB=(I_1-I_2)/(I_1+I_2)\times 100\%.$$

In this case, $I_1$ is an integrated illumination light intensity over the pupil in the case of positive values of the main pupil coordinate, for example sigma x>0, and 12 is the integrated illumination light intensity over the pupil in the case of negative values of the main pupil coordinate, that is to say in the case of sigma y<0.

The advantages of an optical system comprising an illumination optical unit according to the invention and comprising a projection optical unit for imaging the object field into an image field, correspond to those which have already been explained above with reference to the illumination optical unit according to the invention.

In the case of an optical system for EUV projection lithography
comprising an illumination optical unit for obliquely illuminating an illumination field, in which an object field of a downstream imaging catoptric optical unit and a reflective object to be imaged can be arranged,
comprising the imaging catoptric optical unit,
comprising a wavefront manipulation device, which is embodied in such a way that a wavefront of the imaging optical unit results,
which brings about a dependency of an imaging focus shift on a structure variable of the object to be imaged, such that a dependency of the imaging focus shift on the structure variable of the object to be imaged on account of the oblique illumination is at least partly compensated for,
an imaging focus shift against a structure variable of the object to be imaged is compensated for. This is brought about by wavefront influencing. A compensation contribution of the wavefront of the imaging optical unit is generated in order to compensate for the imaging focus shift. The influence of the oblique illumination on an undesirable imaging focus shift is thereby reduced.

The optical system can be fashioned such that both the imaging telecentricity is compensated for via a pupil generating device and the imaging focus shift is compensated for via a wavefront manipulation device.

At least one wavefront manipulator configured as wavefront manipulation device, can be realized via a fine adjustment of mirrors or mirror segments and/or via a deformation of mirrors or mirror segments of the projection optical unit. In particular, symmetry contributions of the wavefront can thereby be manipulated. The symmetry contributions can be manipulated selectively on the basis of a set of functions, for example on the basis of Zernike polynomials. In particular, desired values predefined via optimization calculations can thereby be attained. Wavefront manipulators suitable in principle are known from DE 10 2007 019 570 A1, DE 10 2008 000 990 B3 and U.S. Pat. No. 5,420,436.

The advantages of a projection exposure apparatus comprising an optical system according to the invention and comprising an EUV light source, correspond to those which have already been explained above with reference to the illumination optical unit according to the invention and with reference to the optical system according to the invention.

A method for setting an optical system according to the invention comprising the following steps:
determining an object imaging variable, dependent on an object structure variable of a predefined reference object,
predefining a compensation imaging parameter in such a way that a structure-dependent total imaging variable results, wherein the total imaging variable lies within a predefined tolerance range of imaging variable values, uses the compensation possibilities of the pupil generating device and/or of the wavefront manipulation device. The imaging variable influenced via of the setting method can be the telecentricity or the focus shift of the optical system. In this case, it is possible to take account of horizontal object lines perpendicular to the plane of incidence of the oblique illumination and/or vertical object lines in the plane of incidence of the oblique illumination. A tolerance range can be defined by predefining a maximum value of a deviation of the imaging variable from a predefined value or by predefining an average value of a deviation of the imaging variable from a predefined value or by predefining a structure profile of a desired illumination variable. In the setting method it is possible to take account of secondary conditions, for example a minimum transmission of the optical system, or else other imaging variables, for example NILS or contrast. The setting method can be performed in combination with the structural predefinition of an object layout or mask layout. The setting method can be performed iteratively by virtue of the effects of a compensation intervention firstly being determined by measurement or calculation and deviations from predefined values subsequently being reduced by a next intervention step.

The advantages of a production method for producing structured components comprising the following steps:
providing a wafer, on which a layer composed of a light-sensitive material is at least partly applied,
providing a reticle having structures to be imaged,
providing a projection exposure apparatus according to the invention,
setting the optical system of the projection exposure apparatus via the method according to the invention, projecting at least one part of the reticle onto a region of the layer of the wafer with the aid of the projection exposure apparatus, and of a structured component, produced according to a method according to the invention, correspond to those which have already been explained above with reference to the projection exposure apparatus according to the invention and the setting method according to the invention. Illuminations adapted exactly to the component structure to be produced can be predefined, such that, in particular, semiconductor chips having extremely fine and, in particular, complex structures can be produced.

Exemplary embodiments of the invention are explained in greater detail below with reference to the drawing, in which.

Figure 3:
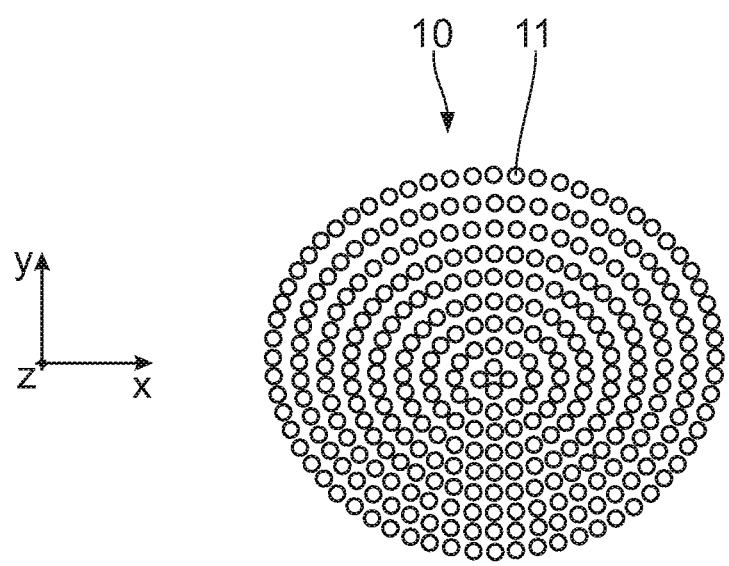
FIG. 3 shows a plan view of a facet arrangement of a pupil facet mirror of the illumination optical unit of the projection exposure apparatus according to FIG. 1.
Figure 5:
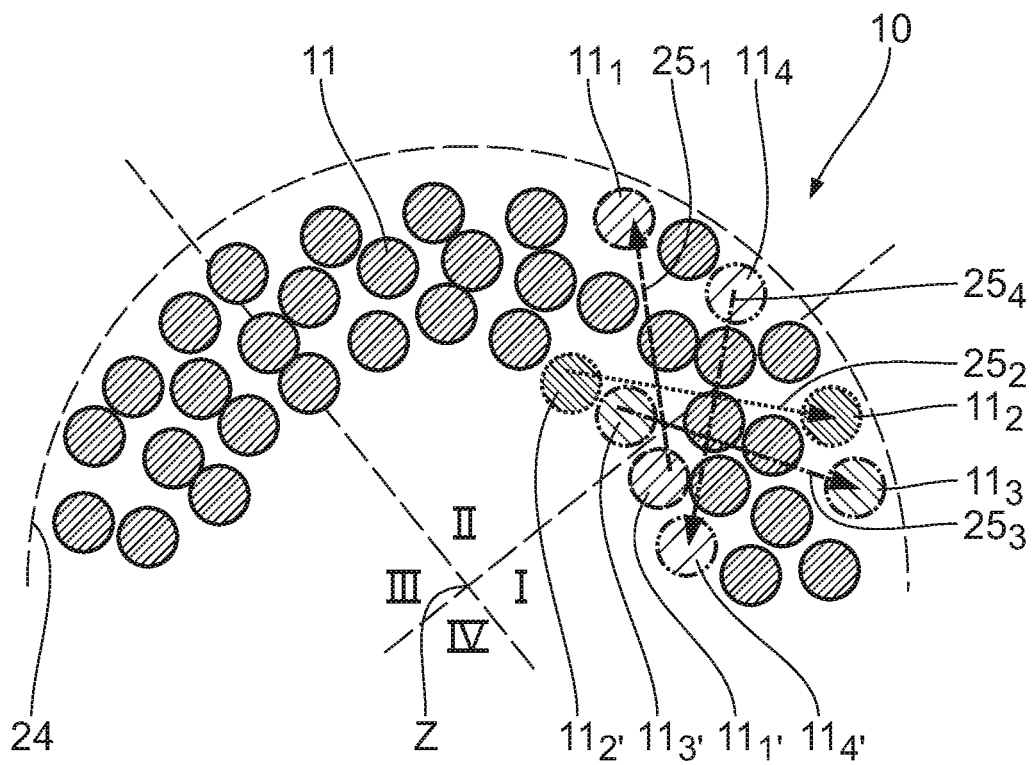
Figure 6:
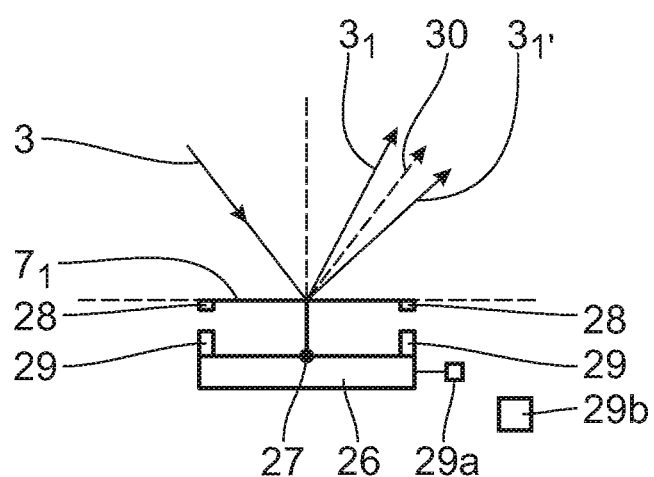
Figure 7:
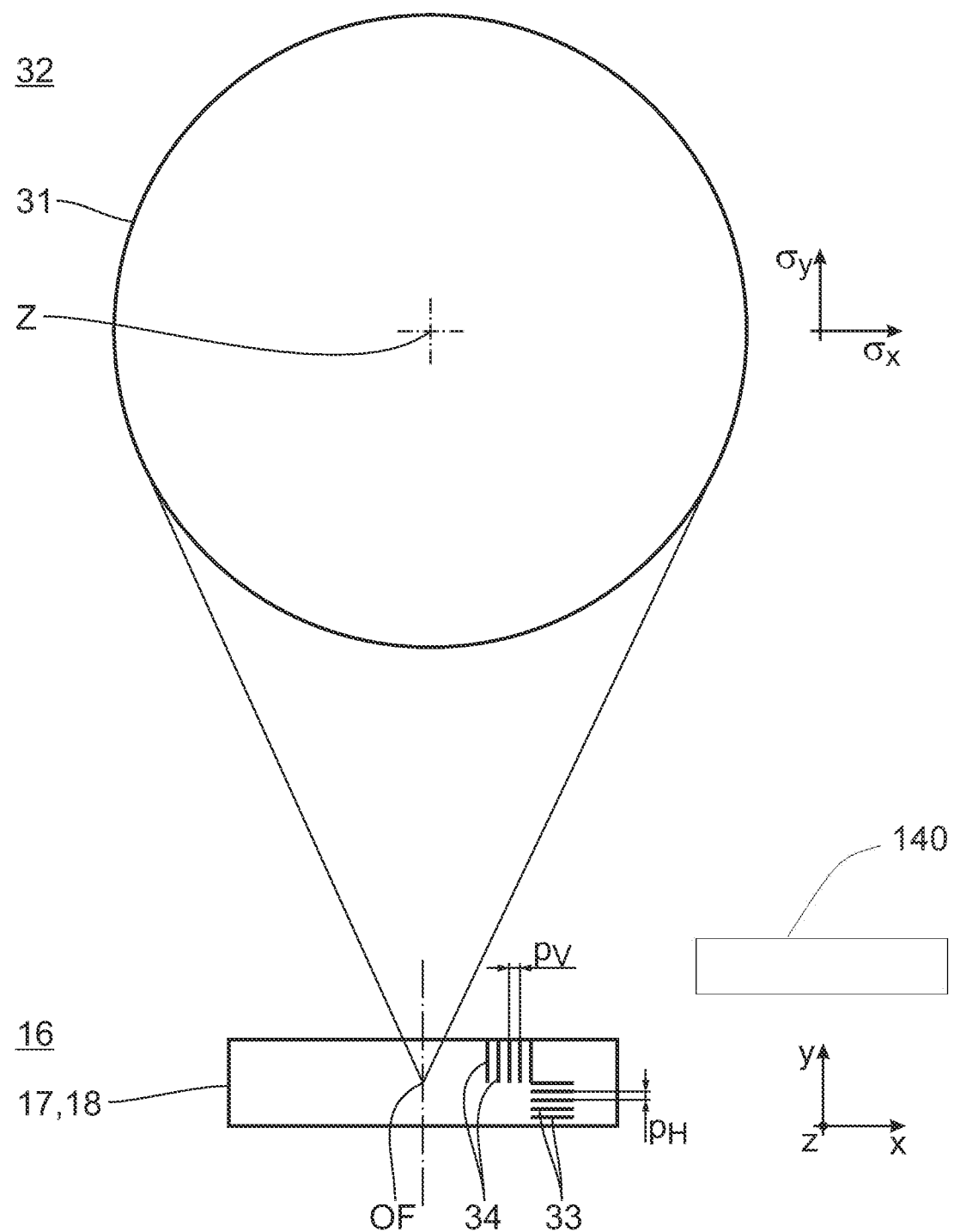
Figure 8:
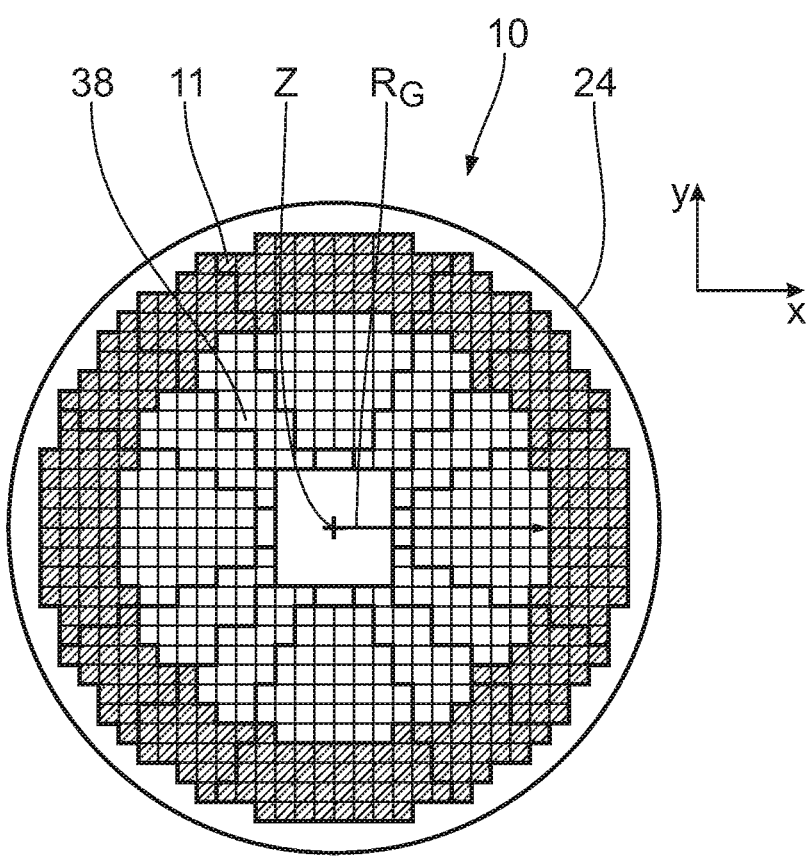
Figure 10:
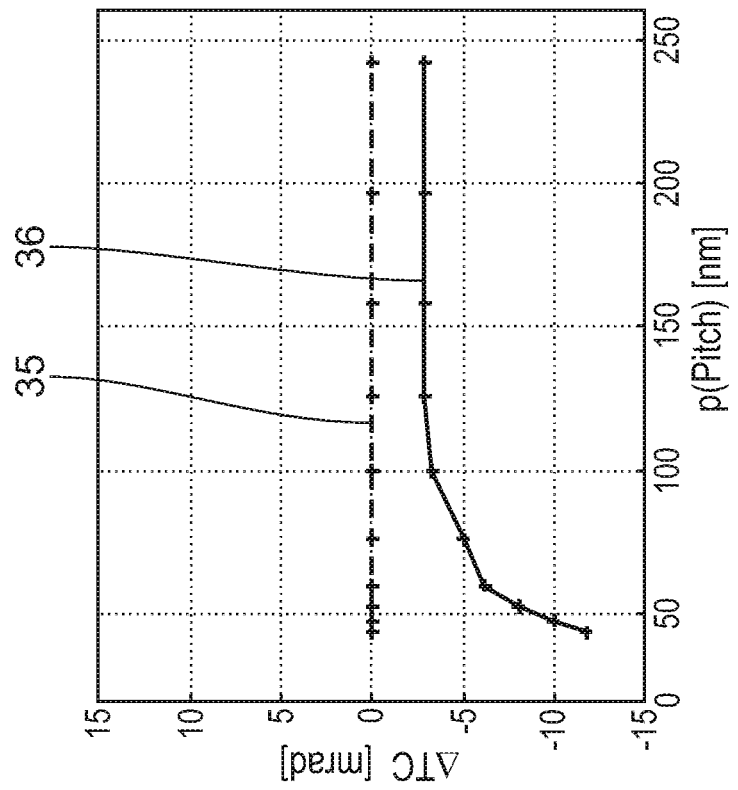
Figure 9:
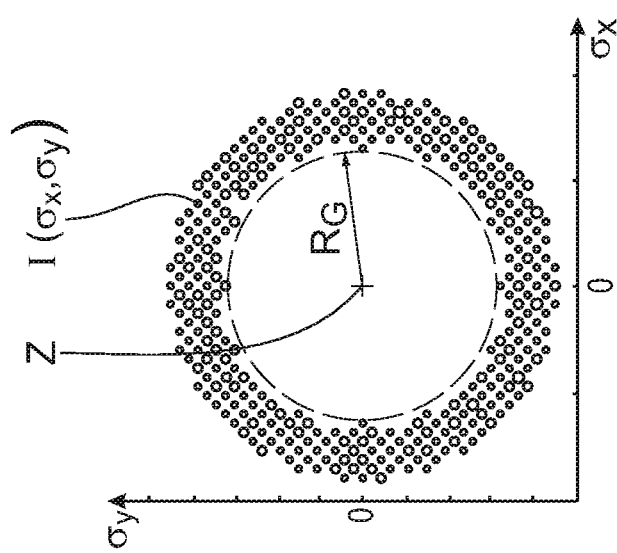
Figure 12:
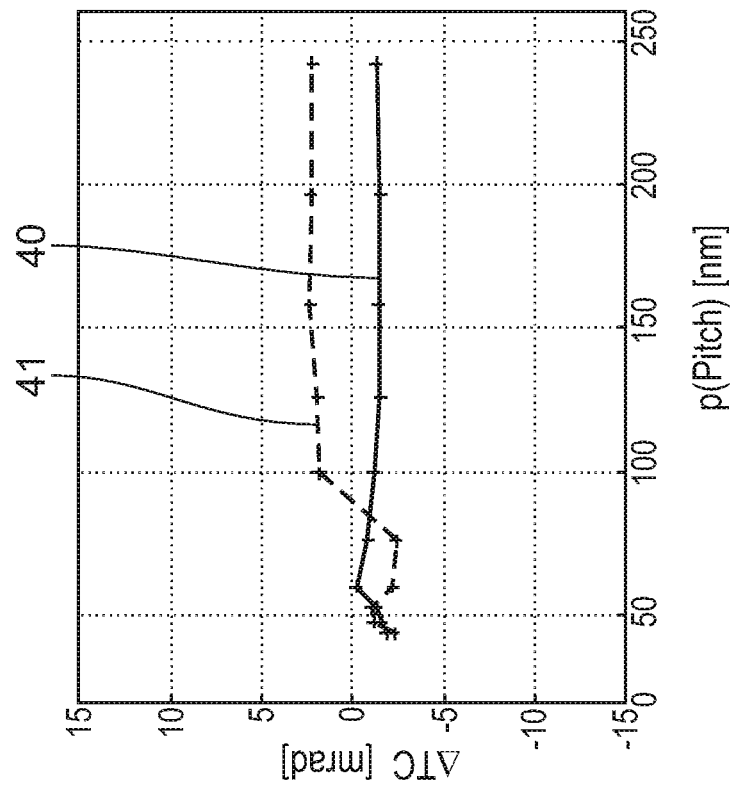
Figure 11:
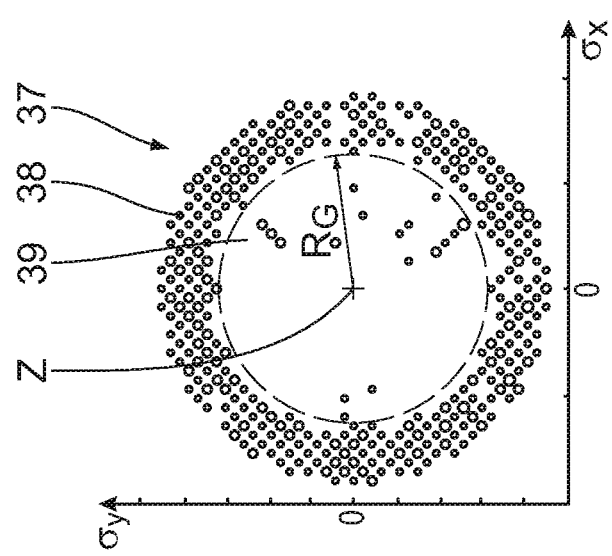
Figure 14:
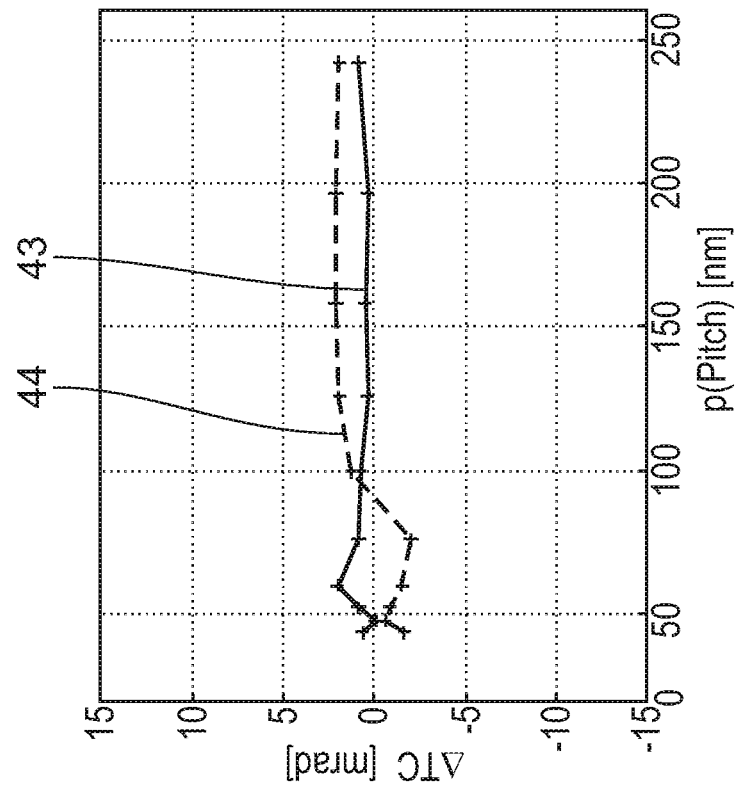
Figure 13:
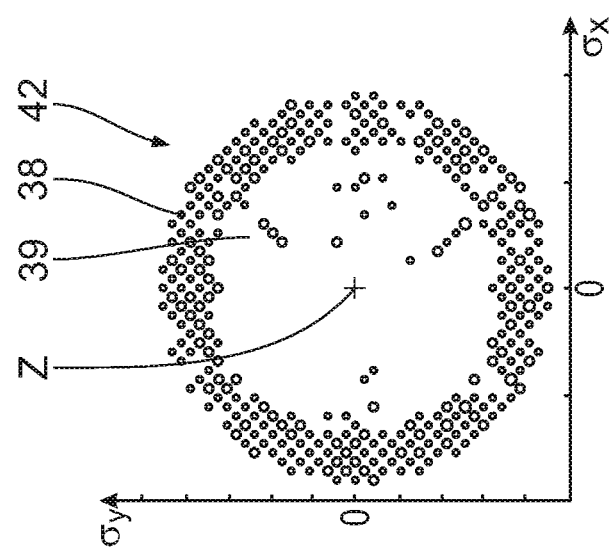
Figure 15:
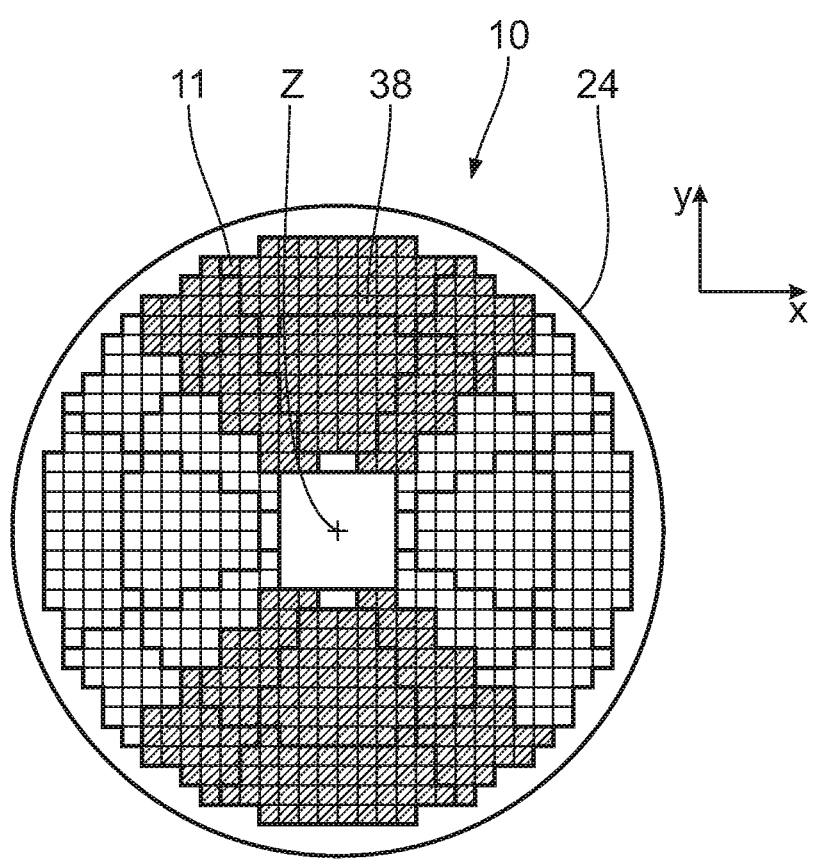
Figure 17:
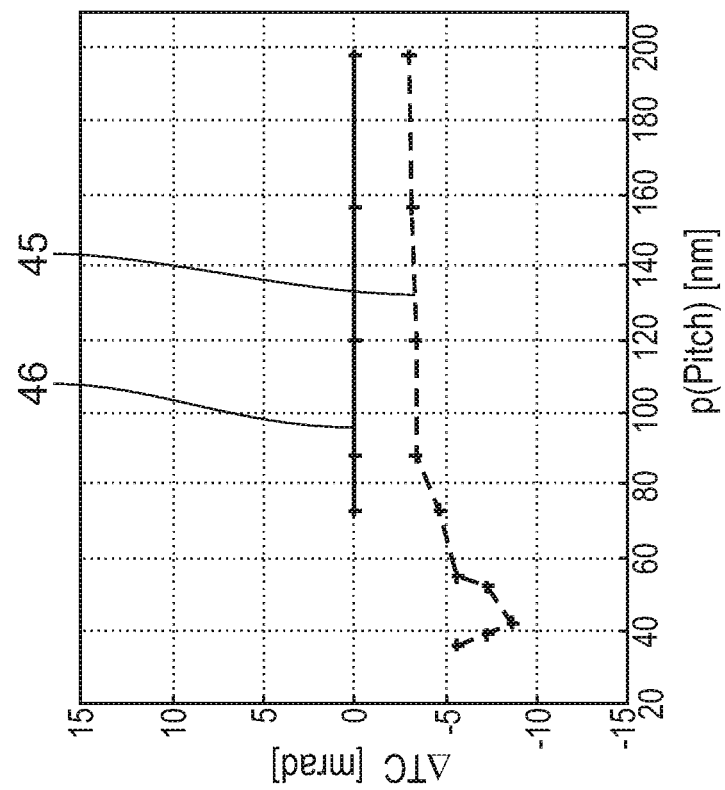
Figure 16:
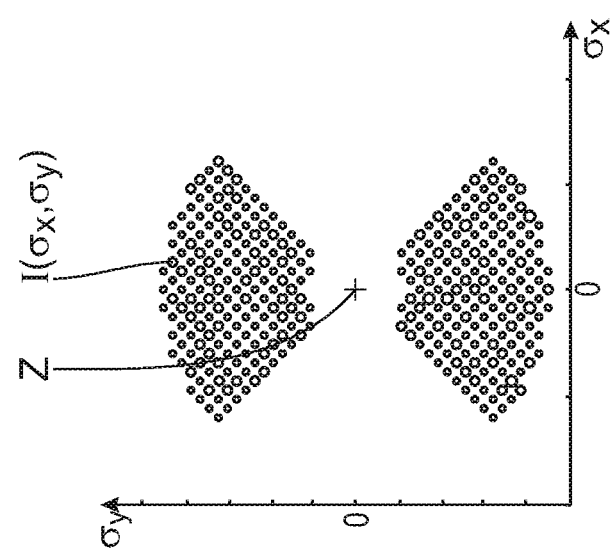
Figure 19:
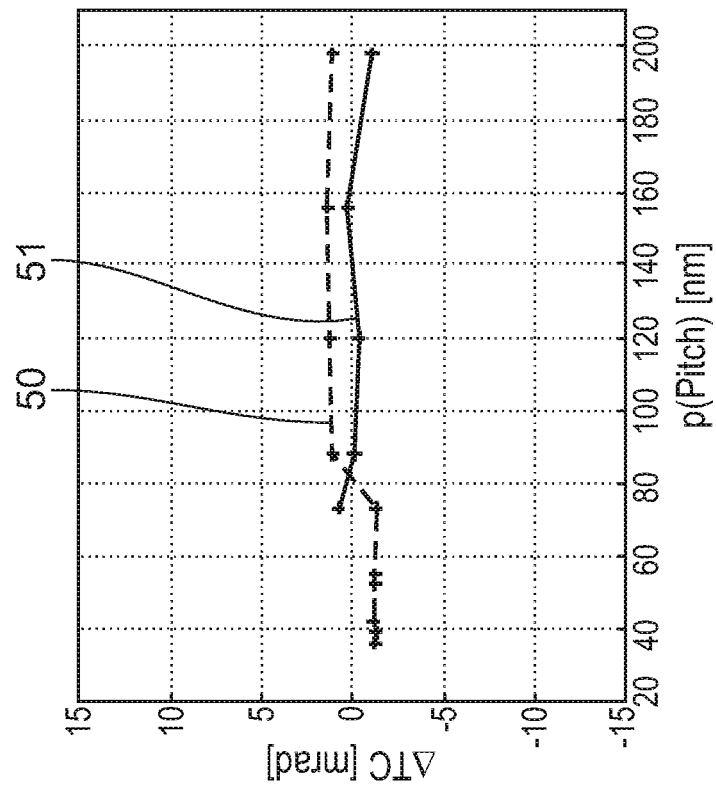
Figure 18:
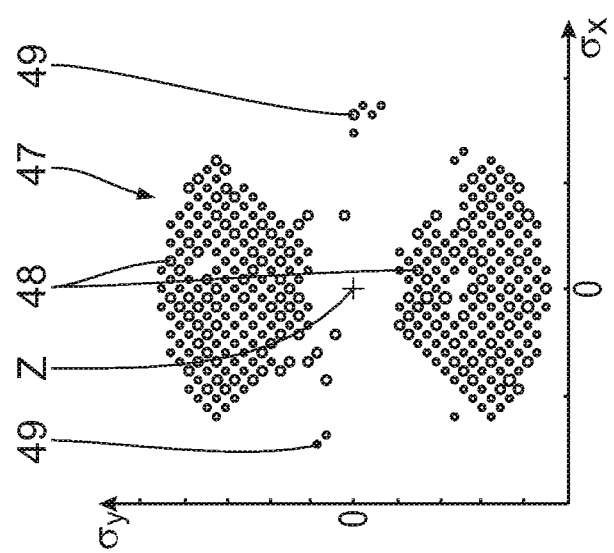
Figure 21:
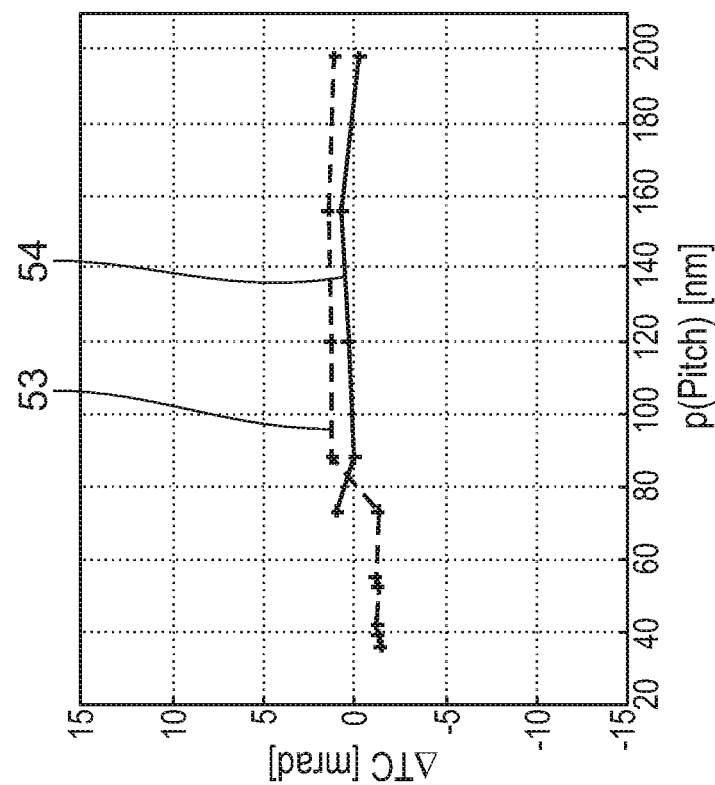
Figure 20:
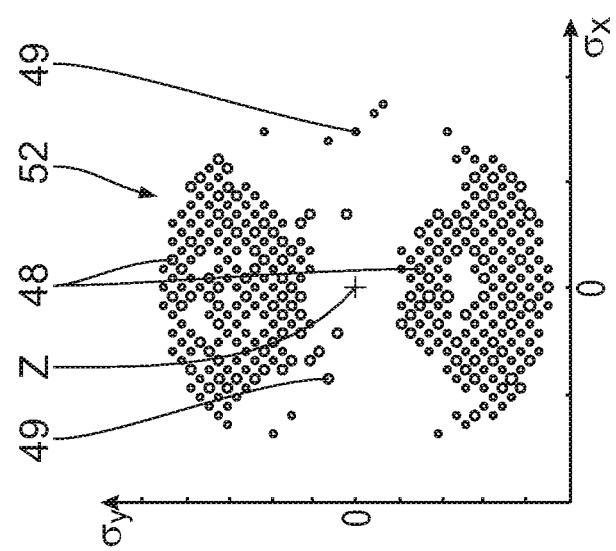
Figure 23:
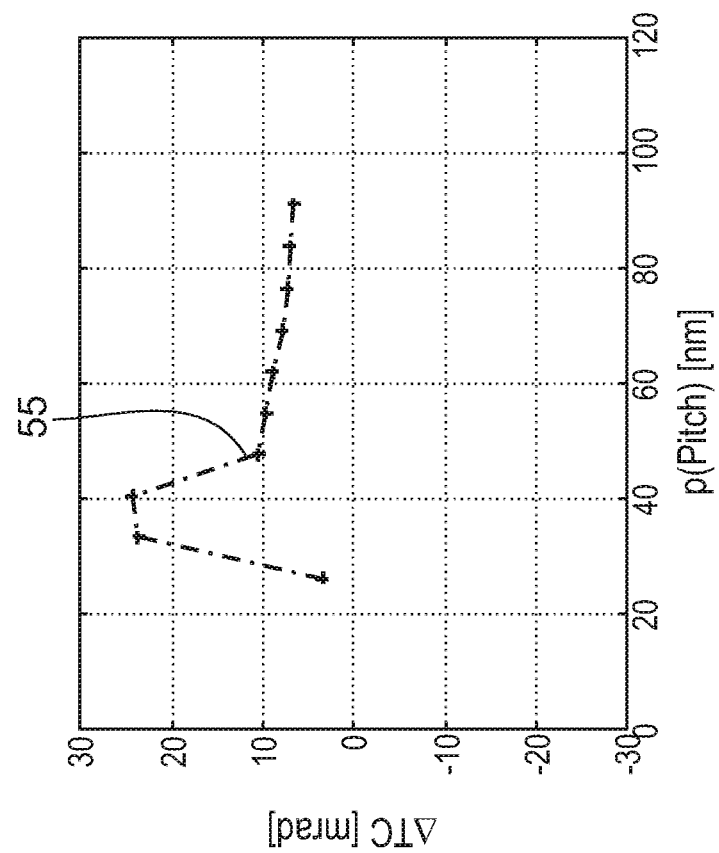
Figure 22:
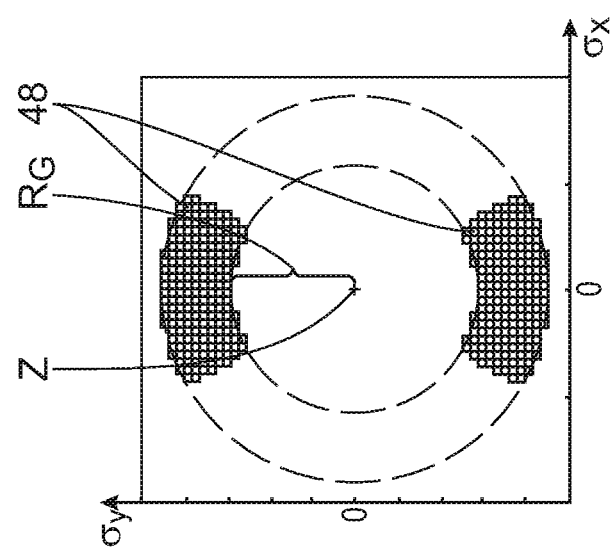
Figure 25:
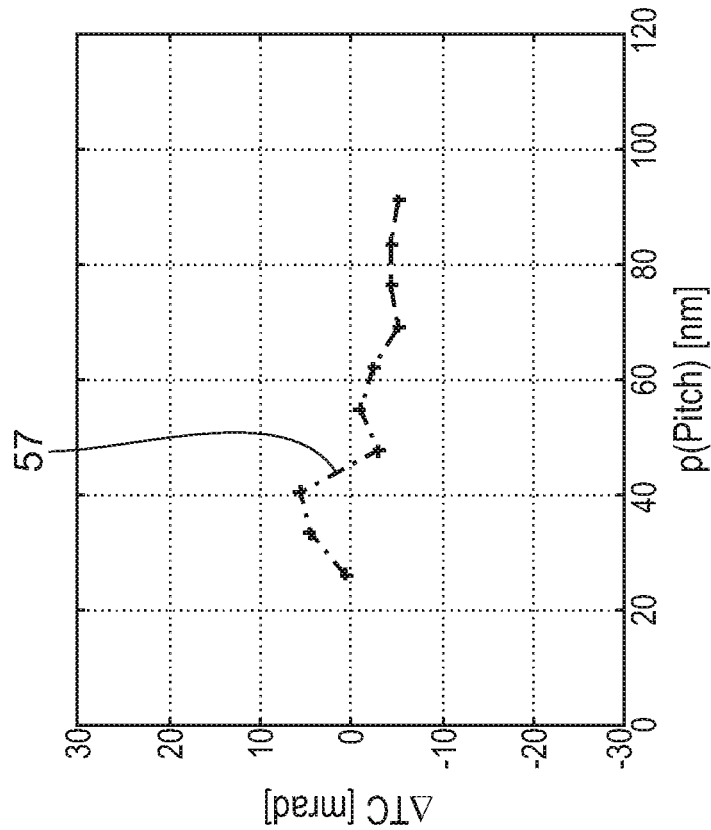
Figure 24:
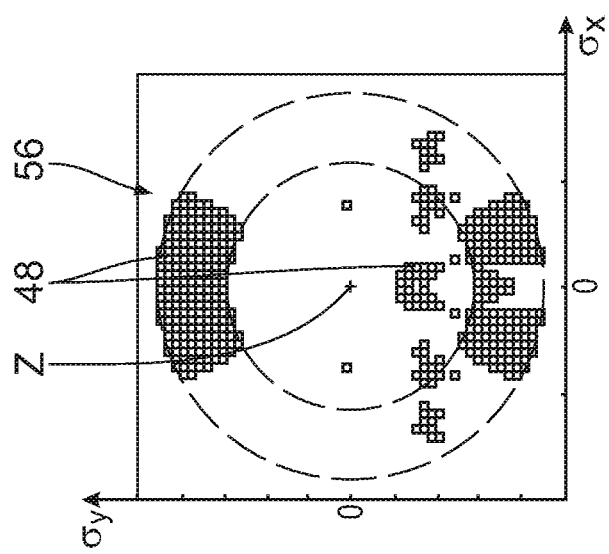

FIG. 5 schematically shows some pupil facets of a pupil facet mirror according to the type of that according to FIG. 3, wherein pairs of the pupil facets which are assigned to one and the same field facet of the field facet mirror of the illumination optical unit via object field illumination channels are in each case highlighted by connecting lines;

FIG. 6 schematically shows a field facet assigned to a pair of pupil facets in a section perpendicular to its reflection surface;

FIG. 7 schematically shows illumination conditions in the case of an oblique illumination of an object to be imaged in an object field on an illumination pupil of the illumination optical unit, wherein functional planes, namely a pupil plane on the one hand and an object plane on the other hand, are illustrated one above another;

FIG. 8 shows a plan view of a facet arrangement of a further embodiment of a pupil facet mirror of the illumination optical unit, wherein a ring-shaped (annular) illumination setting of pupil facets illuminated with illumination light is highlighted;

FIG. 9 shows a pupil coordinate diagram of an illumination pupil of the illumination optical unit in the case of a ring-shaped illumination setting in accordance with FIG. 7 before a compensation setting is carried out;

FIG. 10 shows in a diagram the dependency of a telecentricity deviation (ΔTC) on a typical object structure variable (pitch p) for the illumination setting according to FIG. 9;

FIG. 11 shows, in an illustration similar to FIG. 9, the illumination pupil after a compensation setting has been carried out;

FIG. 12 shows, in an illustration similar to FIG. 10, the dependency between telecentricity deviation and structure variable for the illumination setting according to FIG. 11;

FIG. 13 likewise shows, in an illustration similar to FIG. 9, a further illumination setting after a compensation setting has been carried out, wherein, in contrast to the illumination setting according to FIG. 11, turn-off illumination channels, which do not contribute to the object field illumination, are also chosen in the case of the illumination setting according to FIG. 13;

FIG. 14 shows, in an illustration similar to FIG. 10, the dependency between telecentricity deviation and structure variable for the illumination setting according to FIG. 13;

FIG. 15 shows, in an illustration similar to FIG. 8, the plan view of a facet arrangement of the pupil facet mirror in the case of a y-dipole illumination setting;

FIG. 16 shows, in an illustration similar to FIG. 9, the pupil coordinate diagram of a y-dipole illumination setting according to FIG. 15 before a compensation setting is carried out;

FIG. 17 shows, in an illustration similar to FIG. 10, the dependency between telecentricity deviation and structure variable for the illumination setting according to FIG. 16;

FIG. 18 shows, in an illustration similar to FIG. 9, the illumination setting after a compensation setting has been carried out;

FIG. 19 shows, in an illustration similar to FIG. 10, the dependency between telecentricity deviation and structure variable for the illumination setting according to FIG. 18;

FIG. 20 likewise shows, in an illustration similar to FIG. 9, a further illumination setting after a compensation setting has been carried out, wherein, in contrast to the illumination setting according to FIG. 18, turn-off illumination channels, which do not contribute to the object field illumination, are also chosen in the case of the illumination setting according to FIG. 20;

FIG. 21 shows, in an illustration similar to FIG. 10, the dependency between telecentricity deviation and structure variable for the illumination setting according to FIG. 20;

FIG. 22 likewise shows, in a pupil coordinate diagram, a further example of a y-dipole setting before a compensation setting is carried out;

FIG. 23 shows, in an illustration similar to FIG. 10, the dependency between telecentricity deviation and structure variable for the illumination setting according to FIG. 22;

FIG. 24 shows the illumination setting according to FIG. 22 after a compensation setting has been performed;

FIG. 25 shows the dependency between telecentricity deviation and structure variable for the illumination setting according to FIG. 24; and FIGS. 26 to 29 show, in each case in a diagram, the dependency of an imaging focus shift (best focus shift, bfs) on a structure variable (pitch p) for imaging wavefronts before and after a compensation setting.

A projection exposure apparatus 1 for microlithography serves for producing a micro- or nanostructured electronic semiconductor component. A light source 2 emits EUV radiation used for illumination in the wavelength range of, for example, between 5 nm and 30 nm. The light source 2 can be a GDPP source (gas discharge produced plasma) or an LPP source (laser produced plasma). A radiation source based on a synchrotron can also be used for the light source 2. Information concerning a light source of this type can be found by the person skilled in the art in U.S. Pat. No. 6,859,515 B2, for example. EUV illumination light or illumination radiation 3 is used for illumination and imaging within the projection exposure apparatus 1. Downstream of the light source 2, the EUV illumination light 3 firstly passes through a collector 4, which can be, for example, a nested collector having a multi-shell construction known from the prior art or, alternatively, an ellipsoidally shaped collector. A corresponding collector is known from EP 1 225 481 A. Downstream of the collector 4, the EUV illumination light 3 firstly passes through an intermediate focal plane 5, which can be used for separating the EUV illumination light 3 from undesired radiation or particle portions. After passing through the intermediate focal plane 5, the EUV illumination light 3 firstly impinges on a field facet mirror 6.

Figure 1:
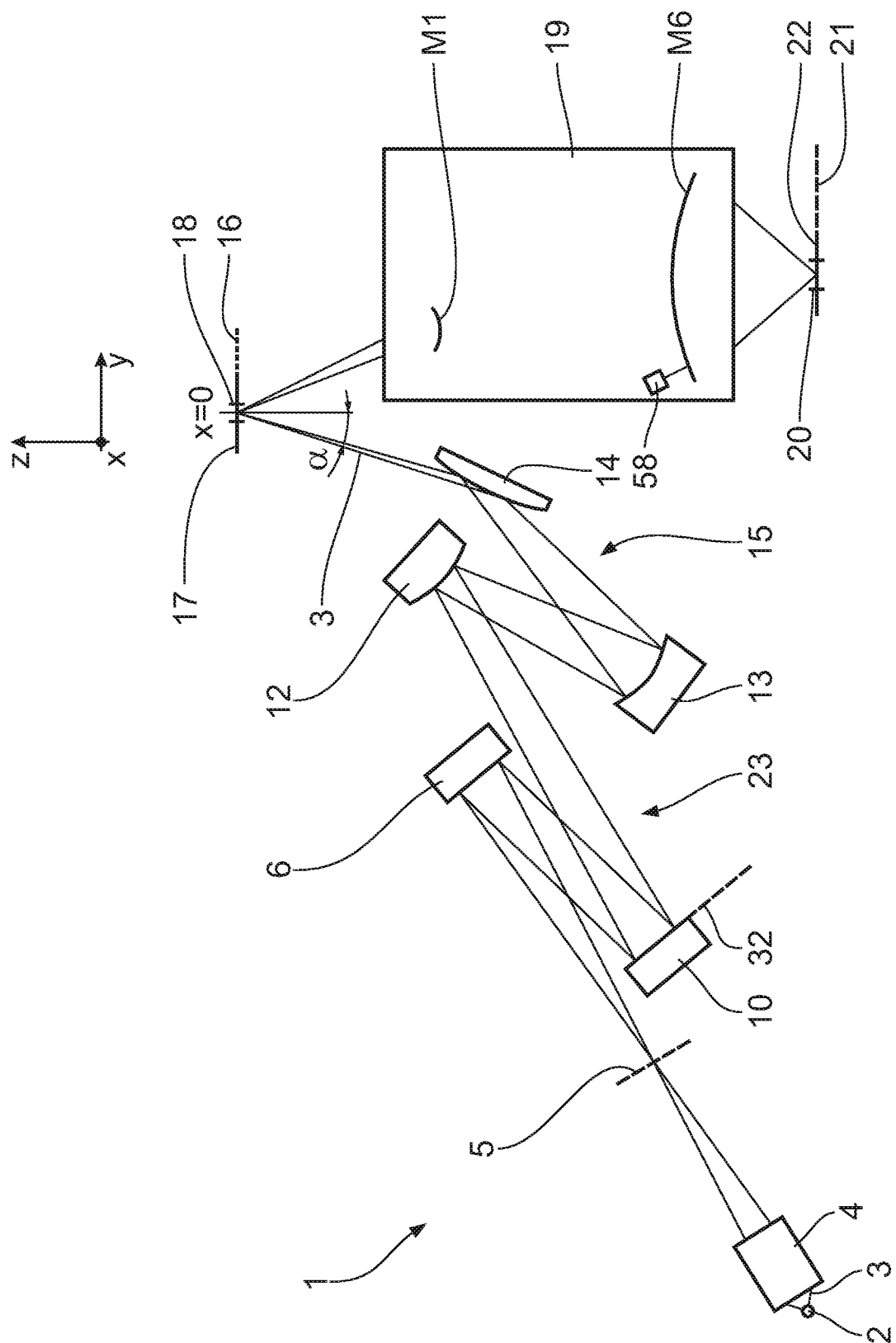
FIG. 1 shows a projection exposure apparatus for microlithography schematically and, with respect to an illumination optical unit, in meridional section.

In order to facilitate the description of positional relationships, a Cartesian global xyz coordinate system is depicted in FIG. 1. In FIG. 1, the x-axis runs perpendicular to the plane of the drawing and out of the latter. The y-axis runs toward the right in FIG. 1. The z-axis runs upward in FIG. 1.

In order to facilitate the description of positional relationships in the case of individual optical components of the projection exposure apparatus 1, a Cartesian local xyz or xy coordinate system is in each case also used in the following figures. The respective local xy coordinates span, unless described otherwise, a respective principal arrangement plane of the optical component, for example a reflection plane. The x-axes of the global xyz coordinate system and of the local xyz or xy coordinate systems run parallel to one another. The respective y-axes of the local xyz or xy coordinate systems have an angle with respect to the y-axis of the global xyz coordinate system, which corresponds to a tilting angle of the respective optical component about the x-axis.

Figure 2:
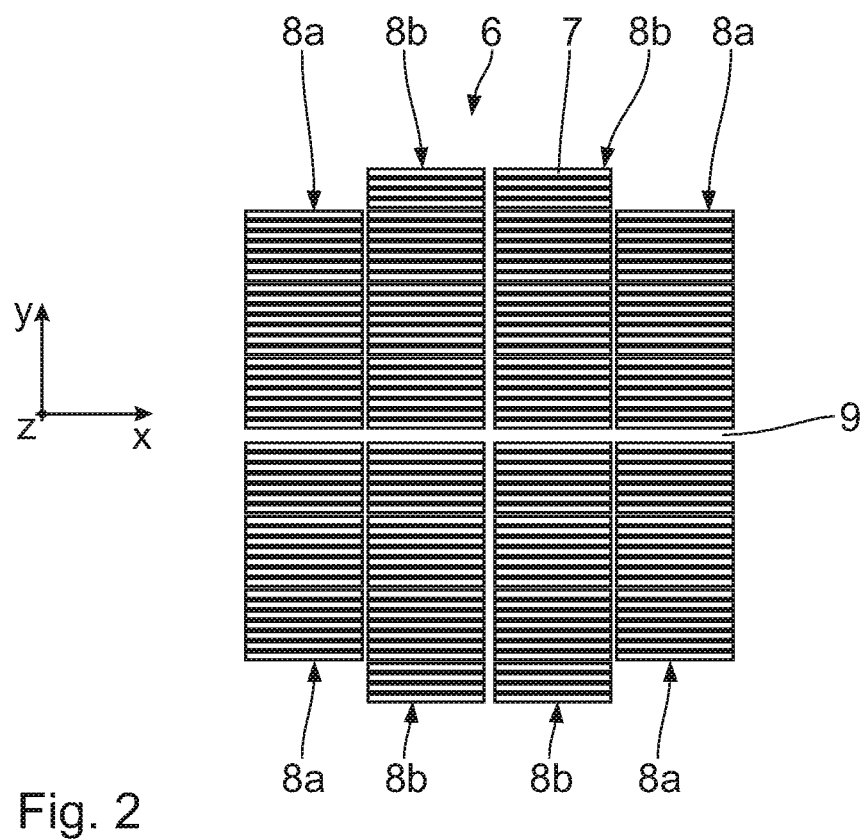
FIG. 2 shows a plan view of a facet arrangement of a field facet mirror of the illumination optical unit of the projection exposure apparatus according to FIG. 1.

FIG. 2 shows, by way of example, a facet arrangement of field facets 7 of the field facet mirror 6. The field facets 7 are rectangular and each have the same x/y aspect ratio. The x/y aspect ratio can be for example 12/5, can be 25/4 or can be 104/8.

The field facets 7 predefine a reflection surface of the field facet mirror 6 and are grouped in four columns each having six to eight field facet groups 8a, 8b. The field facet groups 8a each have seven field facets 7. The two additional marginal field facet groups 8b of the two central field facet columns each have four field facets 7. Between the two central facet columns and between the third and fourth facet rows, the facet arrangement of the field facet mirror 6 has interspaces 9, in which the field facet mirror 6 is shaded by holding spokes of the collector 4.

After reflection at the field facet mirror 6, the EUV illumination light 3 split into beams or partial beams which are assigned to the individual field facets 7 impinges on a pupil facet mirror 10.

FIG. 3 shows an exemplary facet arrangement of round pupil facets 11 of the pupil facet mirror 10. The pupil facets 11 are arranged around a center in facet rings situated one in another. A pupil facet 11 is assigned to each partial beam of the EUV illumination light 3 reflected by one of the field facets 7, such that a respective facet pair impinged upon and comprising one of the field facets 7 and one of the pupil facets 11 predefines an object field illumination channel for the associated partial beam of the EUV illumination light 3. The channel-by-channel assignment of the pupil facets 11 to the field facets 7 is effected depending on a desired illumination by the projection exposure apparatus 1.

Via the pupil facet mirror 10 (FIG. 1) and a downstream transfer optical unit 15 consisting of three EUV mirrors 12, 13, 14, the field facets 7 are imaged into an object plane 16 of the projection exposure apparatus 1. The EUV mirror 14 is embodied as a mirror for grazing incidence (grazing incidence mirror). Arranged in the object plane 16 as object to be imaged is a reflective reticle 17, from which, with the EUV illumination light 3, an illumination region in the form of an illumination field is illuminated which coincides with an object field 18 of a downstream projection optical unit 19 of the projection exposure apparatus 1. The object field illumination channels are superimposed in the object field 18. The EUV illumination light 3 is reflected from the reticle 17.

The projection optical unit 19 images the object field 18 in the object plane 16 into an image field 20 in an image plane 21. The illumination light 3 is therefore also designated as imaging light. Arranged in the image plane 21 is a wafer 22, which bears a light-sensitive layer that is exposed during the projection exposure via the projection exposure apparatus 1. During the projection exposure, both the reticle 17 and the wafer 22 are scanned in a synchronized manner in the y-direction. The projection exposure apparatus 1 is embodied as a scanner. The scan direction is also designated hereinafter as object displacement direction.

The field facet mirror 6, the pupil facet mirror 10 and the mirrors 12 to 14 of the transfer optical unit 15 are parts of an illumination optical unit 23 of the projection exposure apparatus 1. Together with the projection optical unit 19, the illumination optical unit 23 forms an optical system of the projection exposure apparatus 1.

The projection optical unit 19 is embodied as a catoptric optical unit, that is to say as an optical unit having a plurality of mirrors, of which a first mirror M1 and a last mirror M6 in an illumination beam path of the projection optical unit 19 are illustrated in FIG. 1. Since the reticle 17 is embodied such that it is reflective to the illumination light 3, an oblique illumination of the reticle 17 is necessary in order to separate a beam of the illumination light 3 that impinges on the reticle 17 from a beam of the illumination light 3 that is reflected from the reticle 17. The beam of the illumination light 3 impinges on the reticle 17 at an angle α of incidence between a chief ray of a central object field point and a normal to the object plane, wherein a minimum angle α is dependent on an object-side numerical aperture used by the projection optical unit 19. The angle α of incidence is measured in a plane of incidence of the illumination of the reticle 17, which coincides with the yz plane.

Figure 4:
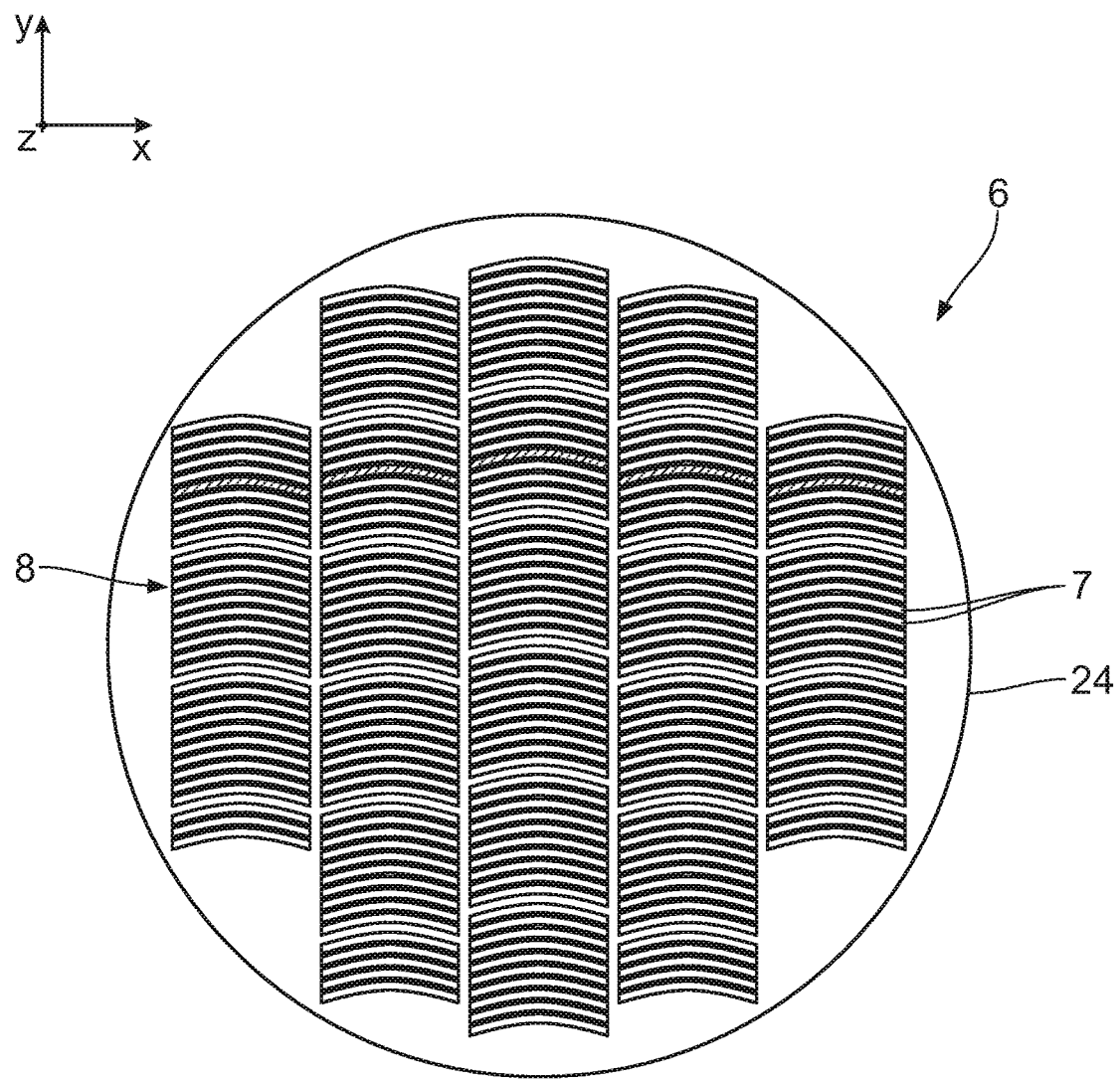
FIG. 4 shows, in an illustration similar to FIG. 2, a facet arrangement of a further embodiment of a field facet mirror.

FIG. 4 shows a further embodiment of a field facet mirror 6. Components corresponding to those which have been explained above with reference to the field facet mirror 6 according to FIG. 2 bear the same reference numerals and are only explained in so far as they differ from the components of the field facet mirror 6 according to FIG. 2. The field facet mirror 6 according to FIG. 4 has a field facet arrangement comprising curved field facets 7. The field facets 7 are arranged in a total of five columns each having a plurality of field facet groups 8. The field facet arrangement is inscribed into a circular boundary of a carrier plate 24 of the field facet mirror.

The field facets 7 of the embodiment according to FIG. 4 all have the same area and the same ratio of width in the x-direction and height in the y-direction, which corresponds to the x/y aspect ratio of the field facets 7 of the embodiment according to FIG. 2.

Each of the field facets 7 of the respective embodiment of the field facet mirror 6 are assigned to exactly two of the pupil facets 11 of the pupil facet mirror 10 via a respective object field illumination channel. The pupil facet mirror 10 therefore has exactly twice as many pupil facets 11 as the field facet mirror 6 has field facets 7.

FIGS. 5 and 6 illustrate this on the basis of a schematically illustrated facet arrangement of a further embodiment of the pupil facet mirror 10. The illustration of the facet arrangement in FIG. 5 is highly schematic. The pupil facet mirror 10 in the embodiment according to FIGS. 3 and 5 actually has approximately 800 pupil facets 11. Each of the pupil facets 11 has a diameter of approximately 10 mm.

Reflection surfaces of the field facets 7 of the field facet mirror 6 are tiltable between a first illumination tilting position for guiding the EUV partial beam impinging on the field facet 7 along a first object field illumination channel in the direction of one of the pupil facets $11_i$ and a further illumination tilting position for guiding the EUV partial beam impinging on the field facet 7 along a further object field illumination channel in the direction of another of the pupil facets $11_j$, which differs from that pupil facet 11 to which the partial beam is guided in the first illumination tilting position of the field facet 7.

FIG. 5 shows schematically in a highlighted fashion a total of four pairs $11_1$, $11_{1'}$; $11_2$, $11_{2'}$; $11_3$, $11_{3'}$; $11_4$, $11_{4'}$ of the pupil facets 11, wherein the pupil facets of each of the pairs are respectively assigned to the two illumination tilting positions of one of the field facets 7. Connecting lines $25_1$, $25_2$, $25_3$, $25_4$ between the pupil facet pairs $11_1$, $11_{1'}$; $11_2$, $11_{2'}$; $11_3$, $11_{3'}$; $11_4$, $11_{4'}$ schematically indicate the path of the EUV partial beam reflected from the assigned field facet 7 when the field facet 7 changes between the two illumination tilting positions.

The connecting lines 25 are illustrated schematically as straight lines. In reality, the connecting lines 25 often do not run straight, but rather in the form of conic sections. The exact form of the course of the connecting lines 25 is dependent on the geometries of an illumination of the pupil facets 11, on the one hand, and a tilting mechanism for the respective field facet 7, on the other hand.

Via the pairs $11_1$, $11_{1'}$; $11_2$, $11_{2'}$; $11_3$, $11_{3'}$; $11_4$, $11_{4'}$, an outer pupil facet $11_1$, $11_2$, $11_3$, $11_4$ and an inner pupil facet $11_{1'}$, $11_{2'}$, $11_{3'}$, $11_{4'}$ are in each case assigned to one another. The inner pupil facets $11_{1'}$ to $11_{4'}$ can also be moved even closer to a center Z of the pupil facet mirror 10 than is illustrated schematically in FIG. 5.

The arrangement of the pupil facets 11 can be roughly subdivided into four quadrants I, II, III, IV wherein the quadrant I in FIG. 5 encompasses those pupil facets 11 which, as viewed from the center Z of the carrier plate 24 indicated in FIG. 4, lie in the sector arranged on the right and the further quadrants II to IV are numbered consecutively in the counterclockwise direction, as usual mathematically.

The field facets 7, which are tiltable between the illumination tilting positions, are furthermore tiltable into a turn-off tilting position. While the two illumination tilting positions are defined exactly in their position via end stops of the tilting of the tiltable field facet 7, this is not the case for the turn-off tilting position, which lies between the two illumination tilting positions. The turn-off tilting position serves for guiding the EUV partial beam impinging on the field facet 7 in the direction of a turn-off beam path, which does not act on the object field 18, the direction differing from the direction of the object field illumination channels.

This is illustrated with reference to FIG. 6, which shows the field facet $7_1$ assigned to the pupil facet pair $11_1$, $11_{1'}$ in a section perpendicular to the reflection surface of the field facet. The field facet $7_1$ is tiltable relative to a field facet carrier 26 about an articulation axis 27, which is perpendicular to the plane of the drawing in FIG. 6, between the two illumination tilting positions defined by stops 28, 29 on the field facet $7_1$, on the one hand, and on the field facet carrier 26, on the other hand, with the aid of an actuator (not illustrated). The field facet $7_1$ is illustrated in the turn-off tilting position lying between these two illumination tilting positions. FIG. 6 furthermore schematically shows the EUV partial beam of the illumination light 3 that is incident on the field facet $7_1$, the object field illumination channel $3_1$ assigned to the first illumination tilting position, the second object field illumination channel $3_{1'}$ assigned to the second illuminating tilting position, and, in a dashed fashion, a turn-off beam path 30.

The field facets 7 are in each case tilted via actuators 29a, which are signal-connected, in a manner not illustrated, to a central control device 29b of the projection exposure apparatus 1.

FIG. 7 schematically illustrates the illumination of the central object field point OF on the reticle 17 in the object field 18 via an illumination pupil 31 of the illumination optical unit 23. The illumination pupil 31 lies in a pupil plane 32 of the illumination optical unit 23. An intensity distribution of the illumination light 3 in the illumination pupil 31 is directly correlated with an illumination angle distribution of the illumination over the object field 18. Depending on how the illumination light 3 impinges on ensembles of pupil facets 11 via the driving of the object field illumination channels by the tiltable field facets 7, this results in a predefined intensity distribution in the illumination pupil 31 and correspondingly an illumination angle distribution during the illumination of, for example, the central object field point OF.

The illumination light intensity distribution can be specified over the illumination pupil on the basis of a distribution I(sigma x, sigma y), wherein sigma x and sigma y are pupil coordinates, that is to say coordinates spanning the illumination pupil 31, which correspond to the object field coordinates x, y.

FIG. 7 furthermore shows by way of example two typical line structures on the reticle 17, that is to say typical variants of structures which are intended to be transferred to the wafer 22 during the projection exposure. The illustration shows horizontal lines 33 of a horizontal line structure and vertical lines 34 of a vertical line structure. A distance between the adjacent horizontal lines 33 is $p_H$ (horizontal pitch). A distance between adjacent vertical lines 34 is $p_V$ (vertical pitch). FIG. 7 also shows a detection unit 140 which is configured to detect a structure variable of the reticle 17, such as the horizontal pitch or the vertical pitch.

The horizontal lines 33 run parallel to the x-axis of the global xyz coordinate system according to FIG. 1. The vertical lines 34 run parallel to the y-axis of the global xyz coordinate system according to FIG. 1.

FIGS. 8 and 15 show by way of example different illumination settings, that is to say different distributions of pupil facets 11 that can be illuminated via object field illumination channels. These different illumination settings correspondingly lead to different distributions of illumination angles with which the illumination field, that is to say the object field 18, is illuminated.

FIG. 8 shows the illumination of pupil facets 11 which lie outside a limiting radius $R_G$ around the center Z of the pupil facet mirror 10. Therefore, this involves an illumination of the pupil facet mirror 10 for producing an annular illumination setting.

FIG. 15 shows a y-dipole illumination setting, in which the pupil facets 11 in the quadrants II and IV are illuminated via object field illumination channels. Complementarily to this, an x-dipole illumination setting is also possible, in which pupil facets 11 in the quadrants I and III are illuminated via object field illumination channels.

FIG. 9 shows, in a pupil coordinate diagram, an exemplary intensity distribution of the illumination light 3 in the case of an annular illumination setting before a compensation setting is carried out. A partial beam of the illumination light 3 impinges in each case at the location of one of the pupil facets 11 and thereby provides for an intensity contribution I (sigma x, sigma y) in the diagram according to FIG. 9. The intensity contributions I are illustrated with different sizes depending on the intensity which is present there and which is integrated over a pupil facet location. Smaller points correspond to lower integrated intensity. The differences in intensity arise on account of different illumination light intensities that are guided via the respective object field illumination channel.

The annular illumination setting according to FIG. 9, at any rate as far as the configuration of the pupil facets 11 on which the illumination light 3 impinges is concerned, is mirror-symmetrical both with respect to the pupil coordinate sigma x and with respect to the pupil coordinate sigma y.

FIG. 10 shows, in a further diagram, the dependency of a telecentricity deviation $\Delta TC$ on an object structure variable p (pitch). The dependency is plotted as a telecentricity curve 35 for the object structure having the vertical lines 34 and as a telecentricity curve 36 for the object structure having the horizontal lines 33.

The vertical structure telecentricity curve 35 proceeds independently of the structure variable in the case of $\Delta TC=0$. The horizontal structure telecentricity curve 36 has a value of approximately −12 mrad in the case of a structure variable p of approximately 40 nm. Toward larger structure variables p, this value decreases in terms of absolute value and attains a value of −5 mrad at p≅80 nm, a value of $\Delta TC \cong -4$ mrad at p=100 nm, and stagnates at a value of $\Delta TC=-3$ mrad for p≥130 nm.

These different profiles of the telecentricity curves 35, 36 for the horizontal lines 33, on the one hand, and the vertical lines 34, on the other hand, result on account of the oblique illumination of the reticle 17, which has the effect that the horizontal lines 33 are illuminated differently, in principle, than the vertical lines 34.

FIG. 11 shows, once again in a pupil coordinate diagram, an intensity distribution for a compensating illumination pupil 37. The compensating illumination pupil 37 is the result of a compensation setting, which will be explained below. The compensating illumination pupil 37 brings about a dependency of the imaging telecentricity TC against the structure variable p of the reticle 17 such that the dependency of the imaging telecentricity TC against the structure variable p as described above with reference to FIG. 10, which results on account of the oblique illumination, is reduced, that is to say at least partly compensated for.

The compensating illumination pupil 37 has a ring-shaped ring pupil contribution 38, the inner limiting radius $R_G$ and the outer limiting radius of which correspond to the limiting radii of the annular illumination setting according to FIG. 9. In addition, the compensating illumination pupil 37 has a compensation pupil contribution 39 within the ring pupil contribution 38, that is to say at pupil coordinate values where $R \leq R_G$.

The compensation pupil contribution 39 is produced by changing over selected field facets 7 between the respective first illumination tilting position, in which the field facets act on a pupil facet 11 in accordance with the illumination setting according to FIG. 9, into a second illumination tilting position, in which a pupil facet within the limiting radius $R_G$ is illuminated. The tiltable field facets 7 are a pupil generating device for generating a predefined illumination pupil.

The compensating illumination pupil 37, with regard to the pupil facets 11 acted on, is exactly mirror-symmetrical neither with respect to the coordinate axis sigma x nor with respect to the coordinate axis sigma y.

Overall, for generating the compensating illumination pupil 37, approximately 5% of the field facets 7 are changed over from the first into the second illumination tilting position. A different changeover percentage is also possible, for example 1%, 2%, 3%, 4%, 6%, 7%, 8%, 9%, 10% or else more than 10%.

FIG. 12 shows, in a $\Delta TC$/pitch diagram corresponding to FIG. 10, a horizontal structure telecentricity curve 40 and a vertical structure telecentricity curve 41 for the compensating illumination pupil 37. The horizontal structure telecentricity curve 40 has a value $\Delta TC \cong -2$ mrad at p=40 nm. The value falls in terms of absolute value down to $\Delta TC \cong 0$ at p≅60 nm and then increases in the case of larger structure variables p slowly up to a value of $\Delta TC \cong -1.5$ mrad at p≅130 nm and remains at this value until p≅250 nm. In absolute terms, the horizontal structure telecentricity curve 40 has a maximum absolute value of the telecentricity deviation $\Delta TC$ of 2 mrad. The vertical structure telecentricity curve has a value of $\Delta TC \cong -2.5$ mrad for structure variables ≤80 nm and then changes sign up to a structure variable p=100 nm and has there a value of $\Delta TC \cong 2$ mrad. This positive value then rises only slightly and has its maximum value of $\Delta TC \cong 2.5$ mrad starting from p≅160 nm. The vertical structure telecentricity curve 41 has a maximum absolute value for the value $\Delta TC$ of 2.5 mrad. As a result of the provision of the compensating illumination pupil 37, therefore, the maximum telecentricity deviation has been reduced from a value of approximately 12 mrad in terms of absolute value to a value of approximately 2.5 mrad in terms of absolute value.

FIG. 13 shows a further compensating illumination pupil 42 in an illustration corresponding to that according to FIG. 11. This compensating illumination pupil 42 is also generated proceeding from an annular illumination setting according to FIG. 9. In this case, some of the field facets 7 were brought not only into the second illumination tilting position, but also into the turn-off tilting position. Overall, approximately 5% of the field facets 7 were brought into the second illumination tilting position and 4% of the field facets 7 were brought into the turn-off tilting position. These percentage proportions can also be variable and have values as already explained above in connection with FIG. 11.

FIG. 14 shows, once again in a $\Delta TC$/p diagram, the profile of a horizontal structure telecentricity curve 43 and of a vertical structure telecentricity curve 44 for the compensating illumination pupil 42.

The curve profile of the telecentricity curves 43, 44 is qualitatively similar to that of the telecentricity curves 40, 41 according to FIG. 12 with the difference that the horizontal structure telecentricity curve 43 is shifted somewhat toward higher $\Delta TC$ values in comparison with the horizontal structure telecentricity curve 40, whereas the vertical structure telecentricity curve 44 is shifted somewhat toward lower $\Delta TC$ values in comparison with the vertical telecentricity curve 41. This results in a reduction again in the maximum absolute value for $\Delta TC$ to a value of 2.1 mrad. Overall, a reduction by more than a factor of 5 was achieved in comparison with the initial maximum value of the absolute value for $\Delta TC$ (cf. FIG. 10, 12 mrad).

The following procedure is adopted for the compensation setting of the illumination optical unit 23:

Firstly, an object imaging variable is determined, which is dependent on the object structure variable of the reticle 17, that is to say in particular the pitch p. The object imaging variable can be, as explained by way of example above, the telecentricity deviation.

In this case, the telecentricity deviation or the telecentricity error denotes the ratio of a lateral image shift to a focus deviation. The focus deviation is measured perpendicular to the image plane 21 and denotes the difference between the z-coordinate of an ideal image point and the z-coordinate of an actual image point at which the image is measured or at which a layer to be exposed on the wafer 22 is situated. The lateral image shift is measured in a plane parallel to the ideal image plane 21. A distance between this measurement plane and the ideal image plane 21 is precisely the focus deviation. The lateral image shift denotes the distance between the ideal image point and the actual image point in the measurement plane parallel to the image plane 21. Such a telecentricity deviation can arise as a result of interaction of the oblique illumination of the reticle 17 with the illumination light 3. The telecentricity deviation can additionally be influenced via the configuration of the illumination pupil.

The telecentricity deviation can either be measured or be calculated with the aid of an optical simulation calculation.

Afterward, a compensation imaging parameter, that is to say the intensity distribution within the illumination pupil 31 in the example explained above, is predefined in such a way as to result in a structure-dependent total imaging variable, which can be composed of the imaging variable before the compensation and the compensation contribution of the imaging variable, wherein the total imaging variable lies within a predefined tolerance range of imaging variable values. In the case of the above-described example of the telecentricity deviation (cf. FIGS. 12 and 14) total telecentricity deviations which led to the undershooting of a telecentricity deviation maximum absolute value of 3 mrad were brought about. The predefinition of the compensation imaging parameter can be determined by empirical determination of the compensation influence of individual field facet tilting changeovers. Alternatively or additionally, the compensation influence can be determined computationally via optical simulation calculations.

In the case of the object imaging variable which is determined and compensated for, it is possible to take account of horizontal object lines perpendicular to the illumination plane of incidence and/or vertical object lines in the illumination plane of incidence. Instead of a predefinition of a maximum value of a deviation of the imaging variable from a predefined value, it is also possible to predefine an average value of a deviation of the imaging variable from a predefined value. It is also possible to define a structure dependency profile of a desired imaging variable. In connection with the predefinition of the compensation imaging parameter, it is also possible to take account of secondary conditions, for example a minimum transmission of the illumination optical unit 23, or other imaging variables, such as, for example, an NILS value or a contrast value of the illumination.

NILS ("normalized image log slope") indicates the derivative of the aerial image intensity curve, that is to say an intensity of the imaging light over the image field 20, at the edge position of the imaged structure (e.g. line) and, in a manner comparable to the contrast, is a measure of the quality of the image. The value NILS can be calculated as follows:

$$NILS = CD \times d(\ln I)/dx \, | \, I_0$$
$$= CD/I_0 \times dI/dx \, | \, I_0$$

In this case, CD ("critical dimension") is the line width (generally width of the imaged object), I is the image intensity as a function of the spatial coordinate x, ln is the natural logarithm, $I_0$ is the intensity threshold value at which the aerial image is evaluated. "$|I_0$" means that the derivative is formed at the position x at which the aerial image intensity I assumes the value $I_0$.

A predefinition of the compensation imaging parameter can be effected in combination with the predefinition of a specific layout of the reticle, which is also designated as optical proximity correction. This involves producing a pre-compensating structure profile on the reticle 17, in which aberrations as a result of imaging using the projection exposure apparatus 1 are pre-compensated for structurally.

The predefinition of the compensation imaging parameter can be effected iteratively. Different variants of the generation of a compensating illumination pupil as compensation imaging parameter, proceeding from a y-dipole illumination setting, are described by way of example below with reference to FIGS. 16 to 25.

FIG. 16 shows, in an illustration similar to FIG. 9, a y-dipole setting, wherein pupil facets 11 in the quadrants II and IV of the pupil facet mirror are illuminated.

FIG. 17 shows the profile of a horizontal structure telecentricity curve 45 and of a vertical structure telecentricity curve 46 in an illustration corresponding to that according to FIG. 10.

The horizontal structure telecentricity curve 45 has a value $\Delta TC \cong -5.5$ mrad at $p \cong 35$ nm. In the case of the horizontal structure telecentricity curve 45, the absolute value of the telecentricity deviation firstly falls to a value of $\Delta TC \cong -8$ mrad at $p \cong 42$ nm. Afterward, the telecentricity deviation value rises up to $\Delta TC \cong -3$ mrad at p=85 nm and then remains at this level for larger structure variables p. The vertical structure telecentricity curve 46 has a profile independent of the structure variable at $\Delta TC = 0$. A maximum absolute value for the telecentricity deviation is therefore at a value of approximately 8 mrad in the case of the illumination setting according to FIG. 16.

FIG. 18 shows a compensating illumination pupil 47 which was attained on the basis of the y-dipole pupil according to FIG. 16 by changing over once again approximately 5% of the field facets 7 from a first illumination tilting position into a second illumination tilting position. In the case of the compensating illumination pupil 47, a compensation pupil contribution 49 with illuminated pupil facets 11 in the quadrants I and III is also present alongside a dipole pupil contribution 48 with illuminated pupil facets 11 in the quadrants II and IV.

FIG. 19 once again shows a horizontal structure telecentricity curve 50 and a vertical structure telecentricity curve 51 for the compensating illumination pupil 47. The horizontal structure telecentricity curve 50 runs on a plateau at $\Delta TC \cong -1$ mrad between the structure variables $p \cong 35$ nm and $p \cong 75$ nm. Afterward, the horizontal structure telecentricity curve 50 changes sign and reaches a value of $\Delta TC \cong 1$ mrad at $p \cong 85$ nm and remains approximately at this value for larger structure variables. The vertical structure telecentricity curve 51 remains to a good approximation at $\Delta TC \cong 0$ between the structure variables $p \cong 75$ nm and $p \cong 200$ nm. The two telecentricity curves 50, 51 each have a maximum absolute value for the telecentricity deviation which is at most 1.4 mrad.

FIG. 20 shows, in an illustration corresponding to that according to FIG. 13, a further compensating illumination pupil 52, in which approximately 4% of the field facets were changed over into a second illumination tilting position and approximately 1% of the field facets 7 were changed over into a turn-off tilting position, once again proceeding from a first illumination tilting position, which resulted in the y-dipole illumination setting according to FIG. 16.

FIG. 21 shows a horizontal structure telecentricity curve 53 and a vertical structure telecentricity curve 54 for the compensating illumination pupil 52 according to FIG. 20. A profile of the telecentricity curves 53, 54 approximately corresponds to those of the telecentricity curves 50, 51.

FIG. 22 shows a variant of a y-dipole illumination setting, in which, within the quadrants II and IV, illumination pupils or pupil coordinates are illuminated which are at a distance R from a center Z which is greater than a limiting radius $R_G$. Moreover the two poles of the y-dipole according to FIG. 22 do not sweep over 90° in the circumferential direction around the center Z, as in the case of the y-dipole setting according to FIG. 16, but rather only 60°. With regard to the pole imbalance, $PB_{sigma\ y}=0\%$ holds true for the illumination setting according to FIG. 22. The upper dipole pupil contribution 48 in FIG. 22 therefore has exactly the same integrated illumination light intensity as the lower dipole pupil contribution 48 in FIG. 22.

FIG. 23 shows a desired structure profile of a desired telecentricity curve 55 for horizontal object lines 33. The desired telecentricity curve 55 represents a negative of a telecentricity curve produced on account of the structures on the reticle 17 upon reflection at the reticle 17.

FIG. 24 shows a compensating illumination pupil 56 generated preceding from the y-dipole illumination setting according to FIG. 22. The compensating illumination pupil 56 was once again attained by changing over a portion of the field facets 7 from a first illumination tilting position, in which the setting according to FIG. 22 was illuminated, into a second illumination tilting position. Approximately 15% of the field facets 7 were changed over. The illumination setting according to FIG. 24 has a pole imbalance $PB_{sigma\ y}=-9.59\%$. Therefore, a higher illumination light intensity is present when integrated over the negative sigma y values than when integrated over the positive sigma y values.

Moreover, for the compensating illumination pupil 56, further field facets 7 were changed over from a turn-off tilting position into an illumination tilting position, that is to say additional illumination channels were made available for illuminating the compensating illumination pupil 56. In the case of the compensating illumination pupil 56, the illumination light 3 impinges on approximately 10% more illumination channels than in the case of the illumination setting according to FIG. 22.

The compensating illumination pupil 56 was generated almost exclusively by changing over field facets 7 which illuminated the lower pole—in FIGS. 22 and 24—of the y-dipole setting in the first illumination tilting position, and by switching in further field facets 7. The compensating illumination pupil 56 is mirror-symmetrical with respect to the sigma y-axis.

FIG. 25 shows a total telecentricity curve as a sum of the contributions from a telecentricity deviation produced by the compensating illumination pupil 56 and a reticle-induced telecentricity deviation as total telecentricity curve 57. The total telecentricity curve 57 has a value of $\Delta TC \cong 0$ at $p \cong 25$ nm. The total telecentricity then rises up to a value of $\Delta TC$ of approximately 6 mrad at $p \cong 40$ nm and then falls slowly to a value of $\Delta TC \cong -5.5$ mrad at $p \cong 90$ nm. A maximum absolute value of the total telecentricity deviation $\Delta TC$ is 5.5 mrad in the case of the total telecentricity curve 57.

The effect of a wavefront manipulation device as part of the projection optical unit 19 will be discussed below with reference to FIGS. 26 to 29. The wavefront manipulation device is a manipulator in the form of an adjustment/deformation unit 58 (cf. FIG. 1), which acts on at least one of the mirrors M1 to M6 of the projection optical unit 19 and provides there for a fine adjustment and/or deformation of the mirror or of a segment thereof. The adjustment/deformation unit 58 therefore constitutes a wavefront manipulator of the projection optical unit 19.

Via an adjustment and/or deformation of the mirrors of the projection optical unit 19, it is possible to bring about a corresponding influencing of the wavefront of the imaging light 3 in the image field 20. This wavefront influencing is used for correspondingly influencing an imaging focus shift (best focus shift, bfs), that is to say a z-offset of an image position, of an image on the one hand of the horizontal lines 33 and on the other hand of the vertical lines 34 of the reticle 17.

Figure 26:
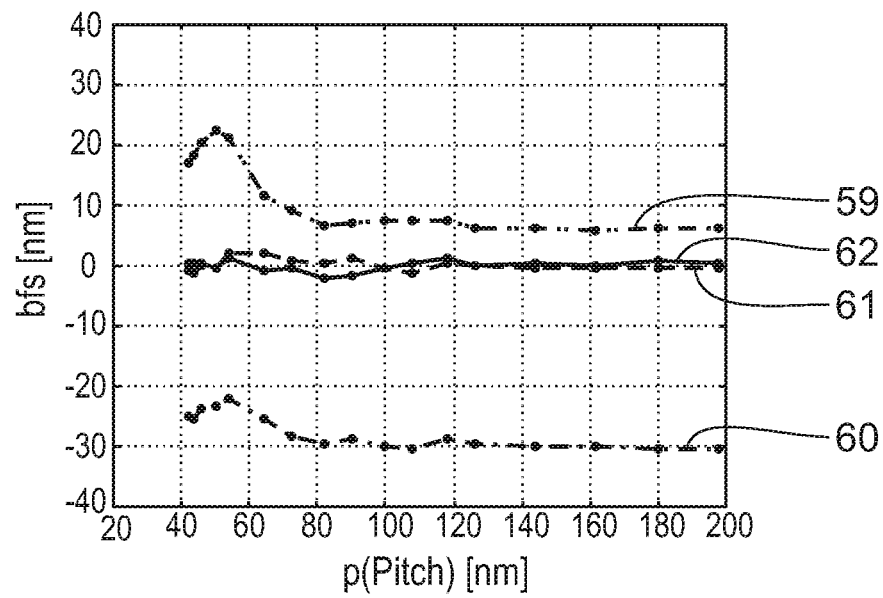

FIG. 26 shows a horizontal structure focus shift curve 59 and a vertical structure focus shift curve 60 in a focus shift (best focus shift, bfs)/structure variable (pitch) diagram. These focus shift curves 59, 60 apply to a non-compensating wavefront. The horizontal structure focus shift curve 59 has a value of $bfs \cong 17$ nm in the case of a smallest detected structure variable $p \cong 40$ nm. This value rises up to $bfs \cong 22$ nm at $p \cong 50$ nm and then falls down to a value of $bfs \cong 8$ nm at $p \cong 80$ nm and then remains approximately at this level. In the case of the vertical structure focus shift curve 60, the value bfs at $p \cong 40$ nm is approximately $-25$ nm, then rises to approximately $-22$ nm at $p \cong 55$ nm and then falls again to $bfs \cong -30$ nm starting from a structure variable $p \cong 80$ nm and remains approximately at this value for larger structure variables.

Via a mirror adjustment/deformation optimization with the aid of the adjustment/deformation unit 58 in which the Zernike polynomials Z4, Z5, Z9, Z12, Z16, Z17, Z21 and Z25 were used as symmetry contributions for the optimization, a compensating wavefront of the imaging light 3 of the catoptric optical unit 19 results in such a way that a compensating horizontal structure focus shift curve 61 and a compensating vertical structure focus shift curve 62 to a good approximation oscillate around the value $bfs \cong 0$ in the structure variable range 40 nm$<p<$200 nm and a maximum absolute value of bfs of less than 2.5 nm results.

Figure 27:
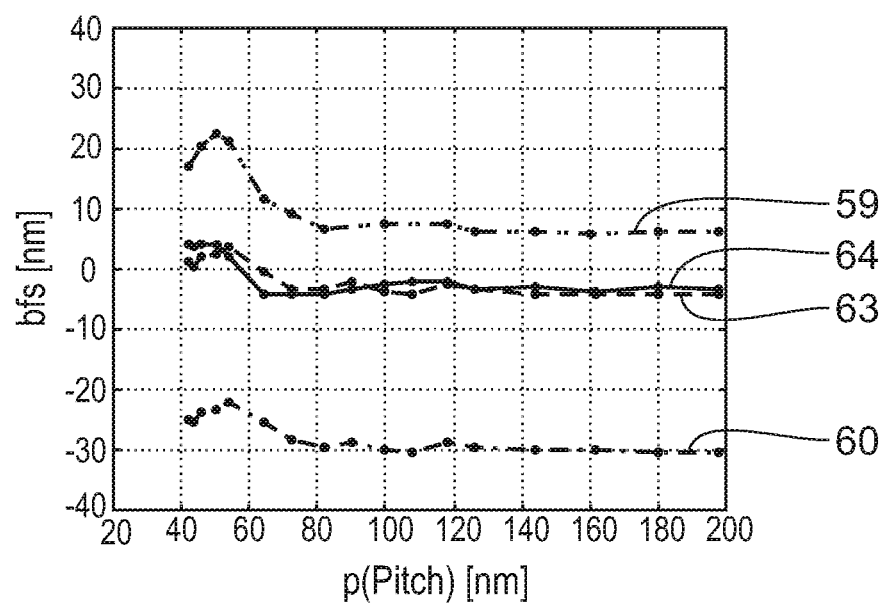
Figure 28:
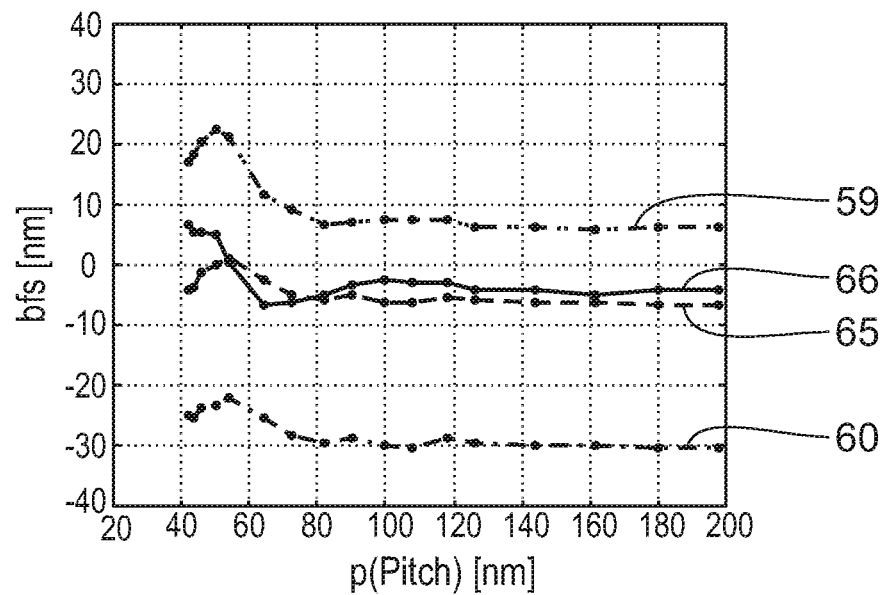
Figure 29:
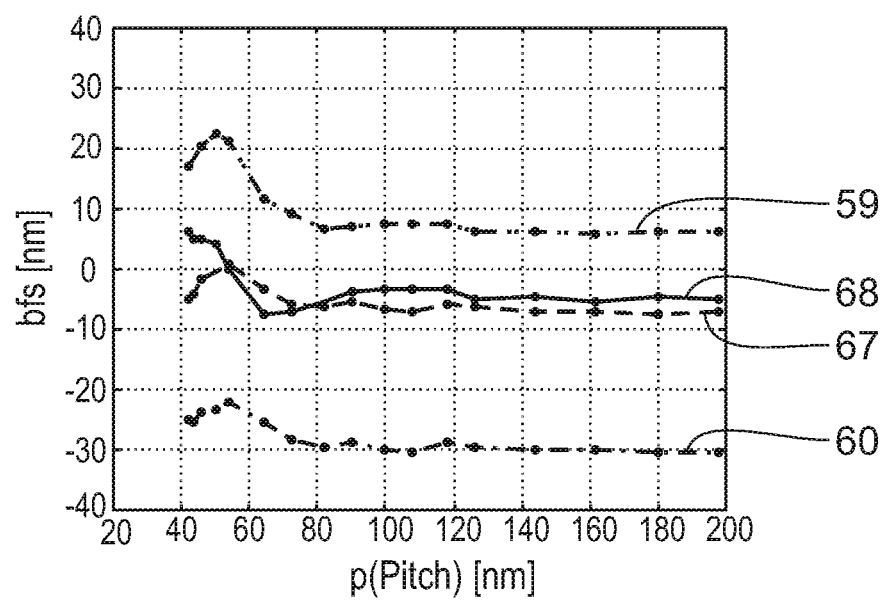

FIGS. 27 to 29 show corresponding adjustment/deformation compensations of the wavefront on the basis of compensating horizontal structure focus shift curves 63, 65, 67 and vertical structure focus shift curves 64, 66 and 68. In the case of the wavefront compensation according to FIG. 27, the symmetry groups were varied in accordance with the Zernike polynomials Z4, Z5 and Z9. In the case of the wavefront compensation according to FIG. 28, the symmetry groups were varied in accordance with the Zernike polynomials Z4 and Z5. In the case of the wavefront compensation according to FIG. 29, the symmetry groups were varied in accordance with the Zernike polynomial Z5. In all cases, a significant reduction of a maximum absolute value of the focus shift likewise arises in comparison with the initial curves 59, 60 for the focus shift. The maximum absolute value is $bfs \cong 4$ nm in the case of the compensation according to FIG. 27, $bfs \cong 8$ nm in the case of the compensation according to FIG. 28, and $bfs \cong 9$ nm in the case of the compensation according to FIG. 29. In comparison with the non-compensating focus shift curves 59, 60, a reduction of the maximum absolute value of the focus shift by a factor of more than 2 arises in all cases.

On account of the reduction of the error contributions of the telecentricity deviation, on the one hand, and the focus shift, on the other hand, which were brought about via the compensations explained above, thus results in correspondingly improved imaging properties for producing extremely fine structures on the wafer 22.

Via the tilting positions of the field facets 7, it is also possible to produce compensating variants of other illumination settings, for example of an x-dipole setting, of a quadrupole illumination setting or of some other multipole illumination setting.

During the projection exposure, the reticle 17 and the wafer 22, which bears a coating that is light-sensitive to the EUV illumination light 3, are provided. Afterward, at least one section of the reticle 17 is projected onto the wafer 22 with the aid of the projection exposure apparatus 1 with the aid of the optical system correspondingly set by the predefinition of at least one compensation imaging parameter. Finally, the light-sensitive layer exposed with the EUV illumination light 3 on the wafer 22 is developed. In this way, the micro- or nanostructured component, for example a semiconductor chip, is produced.

The invention claimed is:

1. A method, comprising:
   a) determining a structure variable of an object in an illumination field of an illumination optical unit;
   b) determining an imaging variable of the illumination optical unit, the imaging variable being dependent on the structure variable of the object;
   c) predefining a compensation imaging parameter so that a structure dependent total imaging variable of the object in the illumination field results, the structure dependent total imaging variable lying within a predefined tolerance range of values for the structure dependent imaging variable;
   d) obliquely illuminating an illumination pupil of the illumination optical unit with illumination light so that an intensity distribution of the illumination light over the illumination pupil produces the structure dependent total imaging variable, wherein, during d) obliquely illuminating the illumination pupil with illumination light causes a dependency of an imaging telecentricity of the illumination optical unit on the structure variable; and
   e) using a pupil generating device of the illumination optical unit to obliquely illuminate the illumination pupil with illumination light to at least partly compensate the dependency of the imaging telecentricity on the structure variable.

2. The method of claim 1, wherein:
   the illumination optical unit comprises a field facet mirror comprising a plurality of field facts; and
   predefining the compensation imaging parameter comprises empirically determining a compensation influence of individual field facet tilting changeovers of the field facet mirror.

3. The method of claim 1, wherein predefining the compensation imaging parameter comprises optical simulation calculations.

4. The method of claim 1, wherein the object imaging variable comprises a telecentricity of the object illumination.

5. The method of claim 1, wherein predefining the compensation imaging parameter takes account of at least one member selected from the group consisting of a minimum transmission of the illumination optical unit, a NILS value, and a contrast value of the illumination.

6. The method of claim 1, wherein the pupil generating device comprises a plurality of adjustable field facets configured so that the imaging telecentricity depends on a position of the field facets.

7. The method of claim 1, wherein the illumination optical unit is part of a projection exposure apparatus which further comprises a projection optical unit, and the method further comprises:
   using the illumination optical unit to illuminate at least some structures of a reticle present in the object field; and
   using the projection optical unit to project at least some of the illuminated structures of the reticle onto a light-sensitive material in an image field of the projection optical unit.

8. The method of claim 1, further comprising:
   providing an imaging catoptric optical unit comprising a wavefront manipulation device configured so that, during use of the imaging catoptric optical unit, the wavefront manipulation device provides a wavefront of the imaging catoptric optical unit which brings about a dependency of an imaging focus shift on the structure variable; and
   the method comprises using the wavefront manipulation device to at least partly compensate the dependency of the imaging focus shift on the structure variable.

9. The method of claim 1, wherein determining the imaging variable comprises detecting the imaging variable.

10. A method, comprising:
    a) determining an imaging variable which is dependent on a structure variable of an object in an illumination field of an illumination optical unit;
    b) predefining a compensation imaging parameter so that a structure dependent total imaging variable of the object in the illumination field results, the total imaging variable lying within a predefined range of values for the structure dependent imaging variable;
    c) obliquely illuminating an illumination pupil of the illumination optical unit with illumination light so that an intensity distribution of the illumination light over the illumination pupil produces the structure dependent total imaging variable, wherein, during c), obliquely illuminating the illumination pupil with illumination light causes a dependency of an imaging telecentricity of the illumination optical unit on the structure variable; and
    d) using a pupil generating device of the illumination optical unit to obliquely illuminate the illumination pupil with illumination light to at least partly compensate the dependency of the imaging telecentricity on the structure variable.

11. The method of claim 10, further comprising determining the structure variable.

12. The method of claim 11, wherein determining the structure variable comprises detecting the structure variable.

13. An optical unit, comprising:
    a first determination device configured to determine a structure variable of an object in an illumination field of the optical unit;
    a second determination device configured to determine an imaging variable which is dependent on the structure variable; and
    a pupil generating device configured so that, during operation of the optical unit, an illumination pupil of the optical unit is obliquely illuminated with illumination light,
    wherein:
        obliquely illuminating the illumination pupil with illumination light brings about a dependency of an imaging telecentricity on a structure variable of an object in the illumination field; and the pupil generating device is configured to obliquely illuminate the illumination pupil with illumination light to at least partly compensate the dependency of the imaging telecentricity on the structure variable; and the optical unit is an EUV projection lithography illumination optical unit.

14. The optical unit of claim 13, wherein the optical unit is configured to:
   determine the structure variable;
   determine the imaging variable;
   predefine a compensation imaging parameter so that a structure dependent total imaging variable of the object in the illumination field results, the total imaging variable lying within a predefined tolerance range of values for the structure dependent imaging variable; and
   obliquely illuminate the illumination pupil with illumination light so that an intensity distribution of the illumination light over the illumination pupil produces the total imaging variable.

15. The optical unit of claim 13, wherein the optical unit is configured so that, during operation of the optical unit, the illumination pupil has:
   a ring shaped ring pupil contribution and a compensation pupil contribution within the ring of the ring pupil contribution; or
   a dipole pupil contribution and a compensation pupil contribution outside dipoles of the dipole pupil contribution.

16. The optical unit of claim 13, wherein the optical unit is configured so that during operation of the optical unit:
   the pupil plane has first and second main coordinates;
   the object field has first and second main coordinates;
   the first main coordinate of the object field is perpendicular to an illumination plane of incidence of the oblique illumination;
   the second main coordinate of the object field is in the illumination plane of incidence of the oblique illumination;
   the first main coordinate of the pupil plane corresponds to the first main coordinate of the object field;
   the second main coordinate of the pupil plane corresponds to the second main coordinate of the object field; and
   the illumination pupil is non-mirror asymmetric with respect to at least one coordinate selected from the group consisting of the first main coordinate of the object field and the second main coordinate of the object field.

17. The optical unit of claim 16, wherein the optical unit is configured so that, during operation of the optical unit, the illumination pupil is mirror symmetric with respect to at least one coordinate selected from the group consisting of the first main coordinate of the object field and the second main coordinate of the object field.

18. The optical unit of claim 13, wherein at least one of the following holds:
   the pupil generating device comprises a plurality of adjustable field facets configured so that the imaging telecentricity depends on a position of the field facets; and
   the pupil generating device is configured so that, during operation of the optical unit, the imaging telecentricity has a maximum absolute value of at most 10 mrad.

19. An optical system, comprising:
   the optical unit according to claim 13; and
   a projection optical unit configured to image an object field into an image field,
   wherein the illumination field of the optical unit coincides with the object field of the projection optical unit.

20. An apparatus, comprising:
   the illumination optical unit according to claim 13; and
   an imaging catoptric optical unit configured so that, during use of the imaging catoptric optical unit, the imaging catoptric optical unit images an object in an object field into an image field,
   wherein:
      the object field of the imaging catoptric optical unit coincides with the illumination field of the illumination optical unit;
      the imaging catoptric optical unit comprises a wavefront manipulation device configured so that, during use of the imaging catoptric optical unit, the wavefront manipulation device provides a wavefront of the imaging optical unit which brings about a dependency of an imaging focus shift on a structure variable of an object in the illumination field to at least partly compensate a dependency of the imaging focus shift on the structure variable; and
      the optical unit is an EUV projection lithography illumination optical unit.

21. The apparatus of claim 13, wherein the first determination device comprises a detector.

* * * * *

UNITED STATES PATENT AND TRADEMARK OFFICE
CERTIFICATE OF CORRECTION

PATENT NO. : 10,976,668 B2
APPLICATION NO. : 16/598408
DATED : April 13, 2021
INVENTOR(S) : Joerg Zimmermann Page 1 of 1

It is certified that error appears in the above-identified patent and that said Letters Patent is hereby corrected as shown below:

In the Specification

Column 1, Line 11, delete "USB" and insert -- USC --;

Column 3, Line 35, delete "PB = $(I_t - I_2) / (I_1 + I_2) \times 100\%$." and insert -- PB = $(I_1 - I_2) / (I_1 + I_2) \times 100\%$. --;

Column 3, Line 39, delete "12" and insert -- $I_2$ --.

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*